(12) United States Patent
Park et al.

(10) Patent No.: US 11,574,700 B2
(45) Date of Patent: Feb. 7, 2023

(54) MEMORY DEVICE FOR COLUMN REPAIR

(71) Applicant: Samsung Electronics Co., Ltd., Suwon-si (KR)

(72) Inventors: Jooyong Park, Hwaseong-si (KR); Minsu Kim, Hwaseong-si (KR); Daeseok Byeon, Seongnam-si (KR); Pansuk Kwak, Seoul (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 0 days.

(21) Appl. No.: 17/245,568

(22) Filed: Apr. 30, 2021

(65) Prior Publication Data
US 2022/0100622 A1 Mar. 31, 2022

(30) Foreign Application Priority Data

Sep. 29, 2020 (KR) .................. 10-2020-0127541

(51) Int. Cl.
G11C 29/00 (2006.01)
G06F 11/20 (2006.01)
(Continued)

(52) U.S. Cl.
CPC ........ G11C 29/838 (2013.01); *G06F 11/2094* (2013.01); *G11C 16/0483* (2013.01);
(Continued)

(58) Field of Classification Search
CPC ..... G11C 29/4401; G11C 29/70; G11C 29/02; G11C 16/3472; G11C 29/785;
(Continued)

(56) References Cited

U.S. PATENT DOCUMENTS 7,679,133 B2   3/2010 Son et al.
8,553,466 B2   10/2013 Han et al.
(Continued)

FOREIGN PATENT DOCUMENTS

CN   109840163 A   6/2019
KR   10-2003-0000766 A   1/2003

OTHER PUBLICATIONS

Extended European Search Report dated Dec. 10, 2021 issued in corresponding European Patent Application No. 21183755.4.

Primary Examiner — April Y Blair
Assistant Examiner — Sazzad Hossain
(74) Attorney, Agent, or Firm — Harness, Dickey & Pierce, P.L.C.

(57) ABSTRACT

A memory device includes a memory cell array including normal memory cells and redundant memory cells; first page buffers connected to the normal memory cells through first bit lines including a first bit line group and a second bit line group and arranged in a first area corresponding to the first bit lines in a line in a first direction; and second page buffers connected to the redundant memory cells through second bit lines including a third bit line group and a fourth bit line group and arranged in a second area corresponding to the second bit lines in a line in the first direction, wherein, when at least one normal memory cell connected to the first bit line group is determined as a defective cell, normal memory cells connected to the first bit line group are replaced with redundant memory cells connected to the third bit line group.

20 Claims, 22 Drawing Sheets

(51) Int. Cl.
*G11C 16/04* (2006.01)
*G11C 29/44* (2006.01)
*G11C 16/10* (2006.01)
*G11C 16/26* (2006.01)
*G11C 16/34* (2006.01)
*G11C 29/12* (2006.01)
*G11C 29/02* (2006.01)
*G11C 29/52* (2006.01)
*G11C 29/42* (2006.01)
*G11C 29/24* (2006.01)

(52) U.S. Cl.
CPC .............. *G11C 29/44* (2013.01); *G11C 16/10* (2013.01); *G11C 16/26* (2013.01); *G11C 16/349* (2013.01); *G11C 16/3472* (2013.01); *G11C 29/02* (2013.01); *G11C 29/24* (2013.01); *G11C 29/42* (2013.01); *G11C 29/4401* (2013.01); *G11C 29/52* (2013.01); *G11C 29/70* (2013.01); *G11C 29/702* (2013.01); *G11C 29/785* (2013.01); *G11C 29/789* (2013.01); *G11C 2029/1204* (2013.01)

(58) Field of Classification Search
CPC ................ G11C 16/349; G11C 29/44; G11C 2029/1204; G11C 29/789; G11C 29/52; G11C 29/24; G11C 29/702; G11C 29/42; G11C 29/838
See application file for complete search history.

(56) References Cited

U.S. PATENT DOCUMENTS

| | | | |
|---|---|---|---|
| 8,559,235 B2 | 10/2013 | Yoon et al. | |
| 8,654,587 B2 | 2/2014 | Yoon et al. | |
| 9,659,666 B2 | 5/2017 | Yang et al. | |
| 10,108,509 B2 | 10/2018 | Qidwai et al. | |
| 10,319,416 B2 | 6/2019 | Oh et al. | |
| 2003/0133340 A1 | 7/2003 | Lee | |
| 2004/0240268 A1* | 12/2004 | Kim | G11C 29/846 365/185.09 |
| 2009/0180339 A1 | 7/2009 | Kim et al. | |
| 2011/0205796 A1* | 8/2011 | Kim | G11C 29/82 365/185.17 |
| 2011/0228615 A1 | 9/2011 | Shiga | |
| 2011/0233648 A1 | 9/2011 | Seol et al. | |
| 2014/0380116 A1* | 12/2014 | Hirano | G06F 11/1666 714/758 |
| 2017/0032849 A1* | 2/2017 | Park | G11C 29/40 |

* cited by examiner

FIG. 9

CRT

| Column Address | Repair Address |
|---|---|
| C_ADDR_BG1 | C_ADDR_BG3 |
| ⋮ | ⋮ |

MEMORY DEVICE FOR COLUMN REPAIR

CROSS-REFERENCE TO RELATED APPLICATION

This application is based on and claims priority under 35 U.S.C. § 119 to Korean Patent Application No. 10-2020-0127541, filed on Sep. 29, 2020, in the Korean Intellectual Property Office, the disclosure of which is incorporated by reference herein in its entirety.

BACKGROUND

Inventive concepts relate to a semiconductor device, and more particularly, to a memory device for column repair.

Semiconductor memory devices may include many memory cells to store data. When at least one defect occurs in memory cells during mass production/fabrication of memory devices, a defective cell may be repaired, and accordingly, the yield of memory devices may be increased. For the repair of a defective cell, a memory device may separately include a redundant memory cell in a spare area, and may replace the defective cell with the redundant memory cell.

In column repair during the repair of a defective cell, a column line (e.g., a bit line) connected to the defective cell may be replaced with a column line connected to a redundant memory cell. For example, the column repair may be performed by mapping (or converting) a column address, which indicates the column line connected to the defective cell, to or into another column address, which indicates the column line connected to the redundant memory cell.

When at least one memory cell among memory cells connected to a plurality of column lines is determined as a defective cell, memory cells connected to some column lines corresponding to a column repair unit may be replaced with redundant memory cells connected to other column lines. In this case, when the number of column lines corresponding to a column repair unit increases, the number of redundant memory cells required for column repair may also increase. When the number of redundant memory cells increases, the chip area of a memory device may also increase, which may decrease efficiency and/or productivity.

SUMMARY

According to some example embodiments, there is provided a memory device including a memory cell array including normal memory cells and redundant memory cells, first page buffers connected to the normal memory cells through first bit lines, the first bit lines including a first bit line group and a second bit line group, the first page buffers arranged in a first area and collinear in a first direction, the first area corresponding to the first bit lines extending in the first direction, and second page buffers connected to the redundant memory cells through second bit lines including a third bit line group and a fourth bit line group, the second page buffers arranged in a second area and collinear in the first direction, the second area corresponding to the second bit lines extending in the first direction. In response to at least one normal memory cell connected to the first bit line group being determined as a defective cell, the memory device is configured to replace normal memory cells connected to the first bit line group with redundant memory cells connected to the third bit line group.

According to some example embodiments, there is provided a memory device including a memory cell array including normal memory cells and redundant memory cells, and peripheral circuitry including first page buffers and second page buffers, the first page buffers connected to the normal memory cells through first bit lines divided into normal bit line groups, and the second page buffers connected to the redundant memory cells through second bit lines divided into redundant bit line groups. The peripheral circuitry is configured to output, as a decoder output signal, first data received from the first page buffers through a first wired OR line and second data received from the second page buffers through a second wired OR line, the outputting according to column repair information. In response to at least one of the normal memory cells being determined as a defective cell, the memory device is configured to generate the column repair information to indicate that one of the normal bit line groups corresponds to one of the redundant bit line groups.

According to some example embodiments, there is provided a memory device including a memory cell array including normal memory cells and redundant memory cells, first page buffers connected to the normal memory cells through first bit lines including a first bit line group and a second bit line group, the first page buffers arranged in a first area and collinearly in a first direction, the first area corresponding to the first bit lines extending in the first direction, second page buffers connected to the redundant memory cells through second bit lines including a third bit line group and a fourth bit line group, the second page buffers arranged in a second area and collinearly in the first direction, the second area corresponding to the second bit lines extending in the first direction, and a peripheral circuitry including first through fourth latches configured to respectively store first column repair information, second column repair information, third column repair information, and fourth column repair information respectively corresponding to the first through fourth bit line groups.

BRIEF DESCRIPTION OF THE DRAWINGS

Embodiments of the inventive concept will be more clearly understood from the following detailed description taken in conjunction with the accompanying drawings in which:

FIG. 9 is a diagram of an example of column repair mapping information involved in the column repair of FIG. 8;

DETAILED DESCRIPTION OF SOME EXAMPLE EMBODIMENTS

Some example embodiments will be clearly described in detail hereinafter so as to be easily implemented by one of ordinary skill in the art of inventive concepts.

Figure 1:
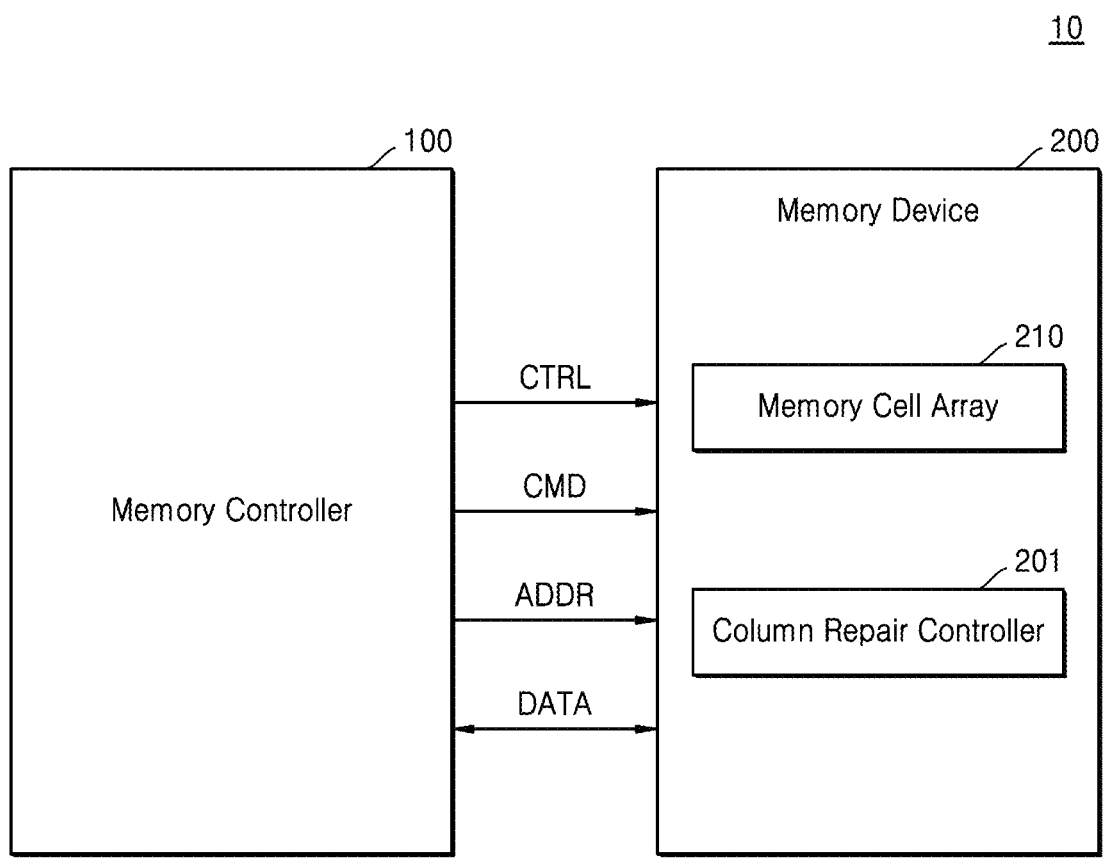
FIG. 1 is a block diagram illustrating a memory system according to some example embodiments.

FIG. 1 is a block diagram illustrating a memory system according to some example embodiments. Referring to FIG. 1, a memory system 10 may include a memory controller 100 and a memory device 200. The memory system 10 may be included in and/or mounted on electronic devices such as a personal computer (PC), a server, a data center, a smartphone, a tablet PC, an autonomous vehicle, a handheld game console, and a wearable device. For example, the memory system 10 may include a storage device such as a solid state drive (SSD).

The memory controller 100 may generally control operations of the memory device 200. For example, the memory controller 100 may provide a control signal CTRL, a command CMD, and/or an address ADDR to the memory device 200 to control the memory device 200. In some example embodiments, the memory controller 100 may control the memory device 200 to store data DATA and/or output the data DATA, in response to a request from an external host.

The memory device 200 may operate under the control of the memory controller 100. In some example embodiments, the memory device 200 may output the data DATA stored therein and/or store the data DATA provided from the memory controller 100, under the control of the memory controller 100.

The memory device 200 may include a memory cell array 210 and a column repair controller 201. The memory cell array 210 may include a plurality of memory cells connected to word lines and to bit lines. A row address in the address ADDR may indicate at least one word line, and a column address in the address ADDR may indicate at least one bit line. As used herein, word lines may correspond to row lines and bit lines may correspond to column lines For example, the memory cells may include flash memory cells. However, example embodiments are not limited thereto, and the memory cells may include at least one of a resistive random access memory (RRAM) cell, a ferroelectric RAM (FRAM) cell, a phase-change RAM (PRAM) cell, a thyristor RAM (TRAM) cell, a magnetic RAM (MRAM) cell, and a dynamic RAM (DRAM) cell. Hereinafter, descriptions will be focused on some example embodiments in which the memory cells include NAND flash memory cells.

In some example embodiments, the memory cell array 210 may include normal memory cells and redundant memory cells. When a cell (hereinafter, referred to as a defective cell) having a defect among the normal memory cells is identified during the test of the memory device 200, a redundant memory cell may store data instead of the defective cell. For example, defective cells among the normal memory cells may be repaired based on redundant memory cells. A defective cell may be a cell that does not pass a certain test, for example a cell that does not store a "1" and/or a cell that does not store a "0". A defective cell may be a cell that has a short circuit, and/or an open circuit, in the electrical components of the cell; however, example embodiments are not limited thereto, and a defective cell may be a cell having another electrical defect.

The column repair controller 201 may perform column repair to repair a defective cell among the memory cells of the memory cell array 210. In some example embodiments, the column repair controller 201 may map a column address, which indicates a bit line connected to a defective cell, to another column address, which indicates a bit line connected to a redundant memory cell. For example, when a defective cell is identified during the test of the memory device 200, the column repair controller 201 may perform address mapping between column addresses. For example, the column repair controller 201 may store mapping information (hereinafter, referred to as column repair mapping information) between column addresses for column repair in the memory cell array 210. The mapping information may be stored in a portion of the memory cell array 210, and/or may be stored in another area of the memory device 200, such as a fuse and/or antifuse bank (not illustrated). However, example embodiments are not limited thereto. When a defective cell is identified during the test of the memory device 200, an external host device (e.g., the memory controller 100 and/or a separate test device) may determine column repair mapping information, and the column repair mapping information may be stored in the memory cell array 210 and/or in a fuse bank and/or an antifuse bank.

In some example embodiments, column repair may be performed on each column repair unit. A column repair unit may correspond to a plurality of bit lines. For example, the column repair controller 201 may replace, e.g. readdress, normal memory cells connected to a plurality of bit lines with redundant memory cells connected to a plurality of bit lines for column repair. In this case, at least one of the normal memory cells may have been determined as a defective cell. Hereinafter, for convenience of description, when particular normal memory cells are replaced/readdressed with particular redundant memory cells according to column repair, a column address, which indicates at least one of bit lines connected to the particular normal memory cells, is referred to as a defect address, and a column address, which indicates at least one of bit lines connected to the particular redundant memory cells, is referred to as a repair address.

In some example embodiments, the column repair controller 201 may read column repair mapping information from the memory cell array 210 and/or from a fuse or antifuse bank during initialization of the memory device 200. A memory access operation such as a program operation and/or a read operation may be performed based on the column repair mapping information. For example, when a defect address is received from the memory controller 100 in a read operation, the column repair controller 201 may convert the defect address into a repair address. Accordingly, the read operation may be performed based on the repair address.

Figure 2:
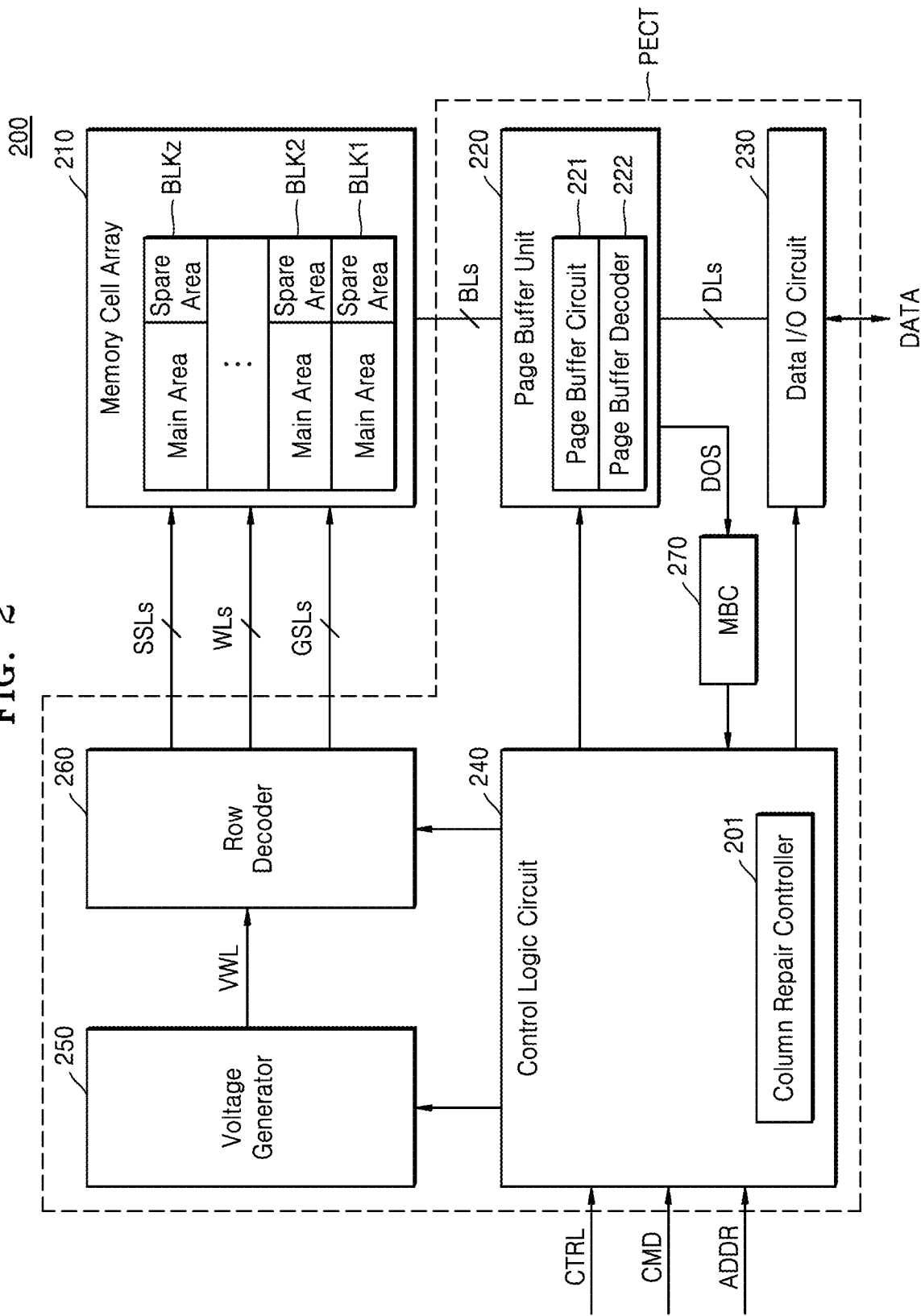
FIG. 2 is a block diagram illustrating a memory device in FIG. 1.

FIG. 2 is a block diagram illustrating a memory device in FIG. 1. Referring to FIG. 2, the memory device 200 may include the memory cell array 210, a page buffer unit 220, a data input/output (I/O) circuit 230, a control logic circuit 240, a voltage generator 250, a row decoder 260, and a mass bit counter (MBC) 270. As used herein, the page buffer unit 220, the data I/O circuit 230, the control logic circuit 240, the voltage generator 250, the row decoder 260, and the MBC 270 may be referred to as peripheral circuits PECT and/or processing circuitry and/or peripheral circuitry.

The memory cell array 210 may include a plurality of memory blocks BLK1 through BLKz (where "z" is a positive integer). Each of the memory blocks BLK1 through BLKz may include a plurality of memory cells. The memory cells may be single-level cells and/or multi-level cells. The memory cell array 210 may be connected to the page buffer unit 220 through bit lines BLs and connected to the row decoder 260 through word lines WLs, string selection lines SSLs, and ground selection lines GSLs.

An area in which the memory cells of the memory cell array 210 are arranged, may be divided into a main area and a spare area. Normal memory cells may be arranged in the main area, and redundant memory cells may be arranged in the spare area. For example, each of the memory blocks BLK1 through BLKz may include normal memory cells in the main area and redundant memory cells in the spare area. The main area may be separate from the spare area. For example, the spare area may be adjacent to the main area. Alternatively or additionally, the main area may be contiguous with the spare area. For example, the main area and the spare area may be interlaced with one another.

In some example embodiments, the memory cell array 210 may include a three-dimensional (3D) memory cell array, which may include a plurality of NAND strings. Each of the NAND strings may include memory cells respectively connected to word lines vertically stacked on a substrate. The disclosures of U.S. Pat. Nos. 7,679,133, 8,553,466, 8,654,587, 8,559,235, and U.S. Patent Application No. 2011/0233648 are incorporated herein in their entirety by references. In some example embodiments, the memory cell array 210 may include a two-dimensional (2D) memory cell array, which may include a plurality of NAND strings in row and column directions.

In some example embodiments, the memory cell array 210 may store column repair mapping information. The column repair mapping information may be stored in one of the memory blocks BLK1 through BLKz, but example embodiments are not limited thereto. For example, the column repair mapping information may be stored in a special memory block that is not divided into a main area and a spare area. For example, the column repair mapping information may be stored in the memory cell array 210 in advance through the test of the memory device 200.

The page buffer unit 220 may select at least one of the bit lines BLs under the control of the control logic circuit 240. The page buffer unit 220 may operate as a write driver and/or as a sense amplifier, according to an operating mode. For example, during a program operation, the page buffer unit 220 may apply a program bit line voltage, which corresponds to the data DATA to be programmed, to a selected bit line. During a read operation, the page buffer unit 220 may read the data DATA stored in a memory cell by sensing a current and/or a voltage of a selected bit line.

The page buffer unit 220 may include a page buffer circuit 221, which includes a plurality of page buffers, and a page buffer decoder 222. The page buffers may be connected to memory cells through the bit lines BLs, respectively. The page buffer circuit 221 may be configured to temporarily store the data DATA to be programmed or the data DATA that has been read from a memory cell. The page buffer decoder 222 may transmit the data DATA from the data I/O circuit 230 to the page buffer circuit 221 or from the page buffer circuit 221 to the data I/O circuit 230 based on a control signal from the control logic circuit 240.

The page buffer decoder 222 may output data which is received from the page buffer circuit 221 through particular data lines (e.g., a first wired OR line WOR1 and a second wired OR line WOR2 in FIG. 4 described below in more detail), based on column repair information. In some example embodiments, the control logic circuit 240 may store column repair information in the page buffer decoder 222 based on column repair mapping information, which is read from the memory cell array 210, during the initialization of the memory device 200. The page buffer decoder 222 may output data, which is received through particular data lines, based on the column repair information stored during the initialization of the memory device 200. For example, the data received through the particular data lines may include a result of detecting a pass state or fail state of a memory cell, which is programmed in a program operation. The output data may be provided to the MBC 270 as a decoder output signal DOS. The page buffer decoder 222 for transmitting the decoder output signal DOS to the MBC 270 will be described in more detail with reference to FIGS. 10 through 16.

The data I/O circuit 230 may provide the data DATA from the memory controller 100 to the page buffer unit 220 through data lines DLs and/or provide the data DATA from the page buffer unit 220 to the memory controller 100 through the data lines DLs. The data I/O circuit 230 may operate according to a control signal from the control logic circuit 240. For example, when normal memory cells are replaced with redundant memory cells according to column repair, the data I/O circuit 230 may transmit the data DATA, which is read from the redundant memory cells, to the memory controller 100 through a data output line, through which data of the normal memory cells is output, based on the control signal.

The control logic circuit 240 may generally control operations of the memory device 200. For example, the control logic circuit 240 may control each element of the memory device 200 based on the command CMD, the address ADDR, and/or the control signal CTRL such that the memory device 200 performs various operations (e.g., a program operation, a read operation, and/or an erase operation).

The control logic circuit 240 may include the column repair controller 201. In some example embodiments, the column repair controller 201 may read column repair mapping information, which has been stored in advance in the memory cell array 210 and/or in another area of the memory device 200, during the initialization of the memory device 200. The column repair controller 201 may store column repair information in the page buffer decoder 222 based on the column repair mapping information. After the initialization of the memory device 200, the column repair controller 201 may convert the address ADDR, which is received in an access operation on the memory device 200, based on the column repair mapping information. For example, when the address ADDR is received from the memory controller 100, the column repair controller 201 may determine whether a column address in the address ADDR is or corresponds to a defect address, e.g. an address of the memory cell array 210 having a defective cell therein, based on the column repair mapping information. When the column address is a defect address, the column repair controller 201 may convert the column address into a repair address. Accordingly, the control logic circuit 240 may control the page buffer unit 220 and the data I/O circuit 230 based on a converted column address.

The voltage generator 250 may generate various voltages for performing program, read, and/or erase operations based on a control signal from the control logic circuit 240. For example, the voltage generator 250 may generate a program voltage, a read voltage, and a program verify voltage as word line voltages VWL.

The row decoder 260 may select one of the word lines WLs and one of the string selection lines SSLs, in response to a control signal (e.g., a row address). For example, the row decoder 260 may apply a program voltage and a program verify voltage to a selected word line during a program operation and may apply a read voltage to a selected word line during a read operation.

The MBC 270 may calculate the number of fail bits (hereinafter, referred to as a fail bit count) in data, which is programmed to the memory cell array 210, based on the decoder output signal DOS from the page buffer decoder 222. At this time, a fail bit may correspond to data read from a memory cell that does not have a desired threshold voltage from among programmed memory cells, and the fail bit count may correspond to the number of memory cells that do not have the desired threshold voltage. For example, during a program operation, data programmed to memory cells may be read based on a program verify voltage. The read data may be transmitted, as the decoder output signal DOS, to the MBC 270 through the page buffer circuit 221 and the page buffer decoder 222. The MBC 270 may calculate a fail bit count based on the decoder output signal DOS. The fail bit count may be provided to the control logic circuit 240.

The control logic circuit 240 may determine a pass or a fail of the program operation (hereinafter, referred to as a program pass or program fail) based on the fail bit count. For example, the control logic circuit 240 may determine a program fail when the fail bit count is greater than or equal to a reference value and determine a program pass when the fail bit count is less than the reference value. When the program fail is determined, a program loop may be repeated. When the program pass is determined, the program operation may be completed. For example, when a certain number of program loops are performed and the program fail is determined, the program operation may be stopped. In this case, the control logic circuit 240 may transmit state information, which indicates that the program operation has failed, to the memory controller 100.

Although the MBC 270 is separately provided from the data I/O circuit 230 in FIG. 2, example embodiments are not limited thereto. For example, the MBC 270 may be included in the data I/O circuit 230.

Figure 3:
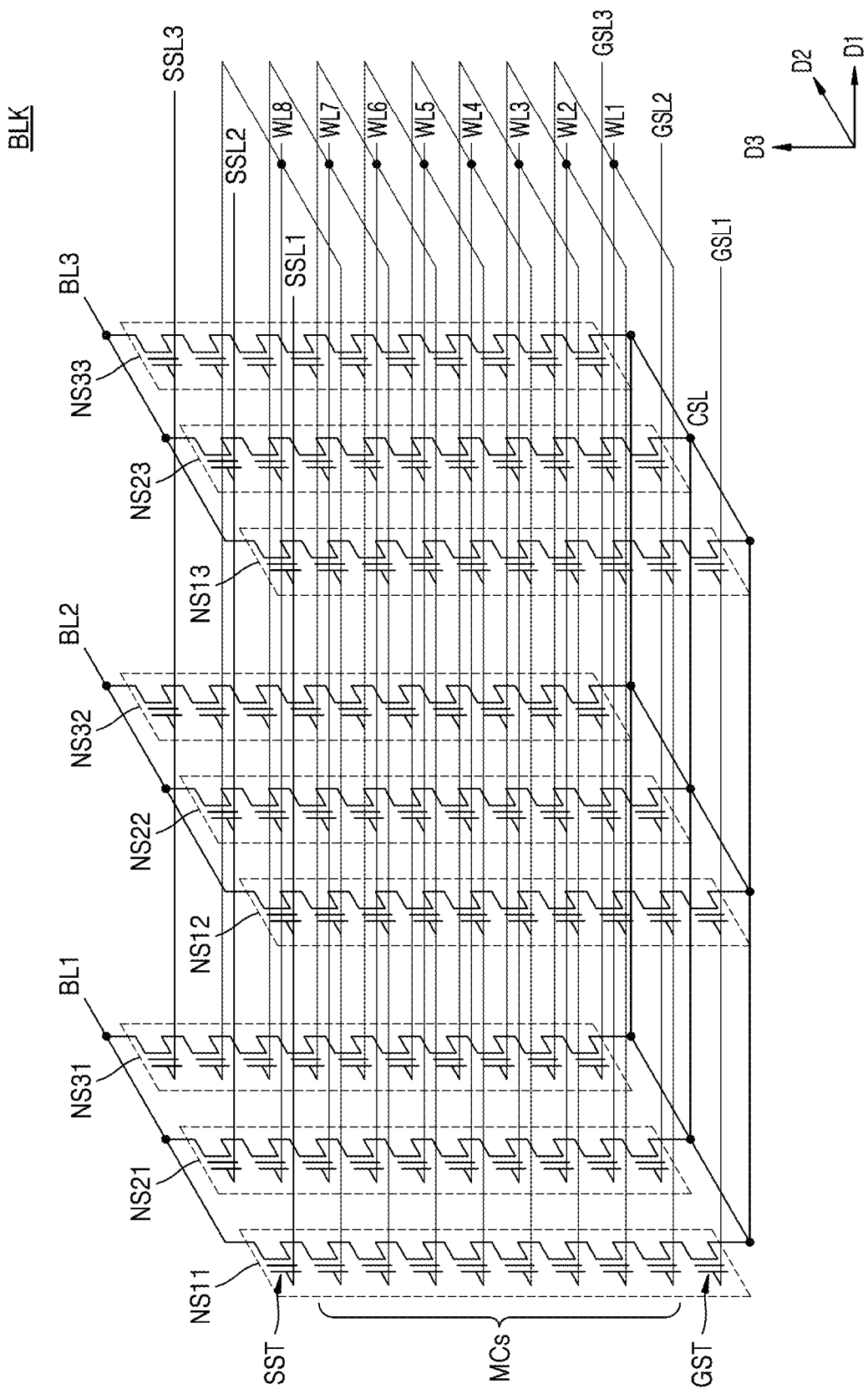
FIG. 3 is a circuit diagram illustrating a memory block according to some example embodiments.

FIG. 3 is a circuit diagram illustrating a memory block according to some example embodiments. Referring to FIG. 3, a memory block BLK may correspond to one of the memory blocks BLK1 through BLKz in FIG. 2. The memory block BLK may include NAND strings NS11 through NS33, of which each (e.g., NS11) may include a string selection transistor SST, a plurality of memory cells MCs, and a ground selection transistor GST, which are connected in series to one another. The transistors, e.g., the string selection transistor SST and the ground selection transistor GST, and the memory cells MCs included in each NAND string may form a stack structure on a substrate in a third direction D3 (e.g., a vertical direction). Further although each of the string selection transistors SST, the ground selection transistors GST, and the memory cells MCs are illustrated as being NMOS transistors, example embodiments are not limited thereto, and at least one of the string selection transistors SST, the ground selection transistors GST, and the memory cells MCs may be PMOS transistors.

Word lines WL1 through WL8 may extend in a first direction D1, and first through third bit lines BL1 through BL3 may extend in a second direction D2. The NAND strings NS11, NS21, and NS31 may be between the first bit line BL1 and a common source line CSL; the NAND strings NS12, NS22, and NS32 may be between the second bit line BL2 and the common source line CSL; and the NAND strings NS13, NS23, and NS33 may be between the third bit line BL3 and the common source line CSL. The string selection transistor SST may be connected to a corresponding one of string selection lines SSL1 through SSL3. Each of the memory cells MCs may be connected to a corresponding one of the word lines WL through WL8. The ground selection transistor GST may be connected to a corresponding one of ground selection lines GSL1 through GSL3. The string selection transistor SST may be connected to a corresponding one of the first through third bit lines BL1 through BL3, and the ground selection transistor GST may be connected to the common source line CSL. Here, the numbers of NAND strings, memory cells MCs within NAND strings, word lines, bit lines, ground selection lines, and string selection lines may vary with example embodiments.

Figure 4:
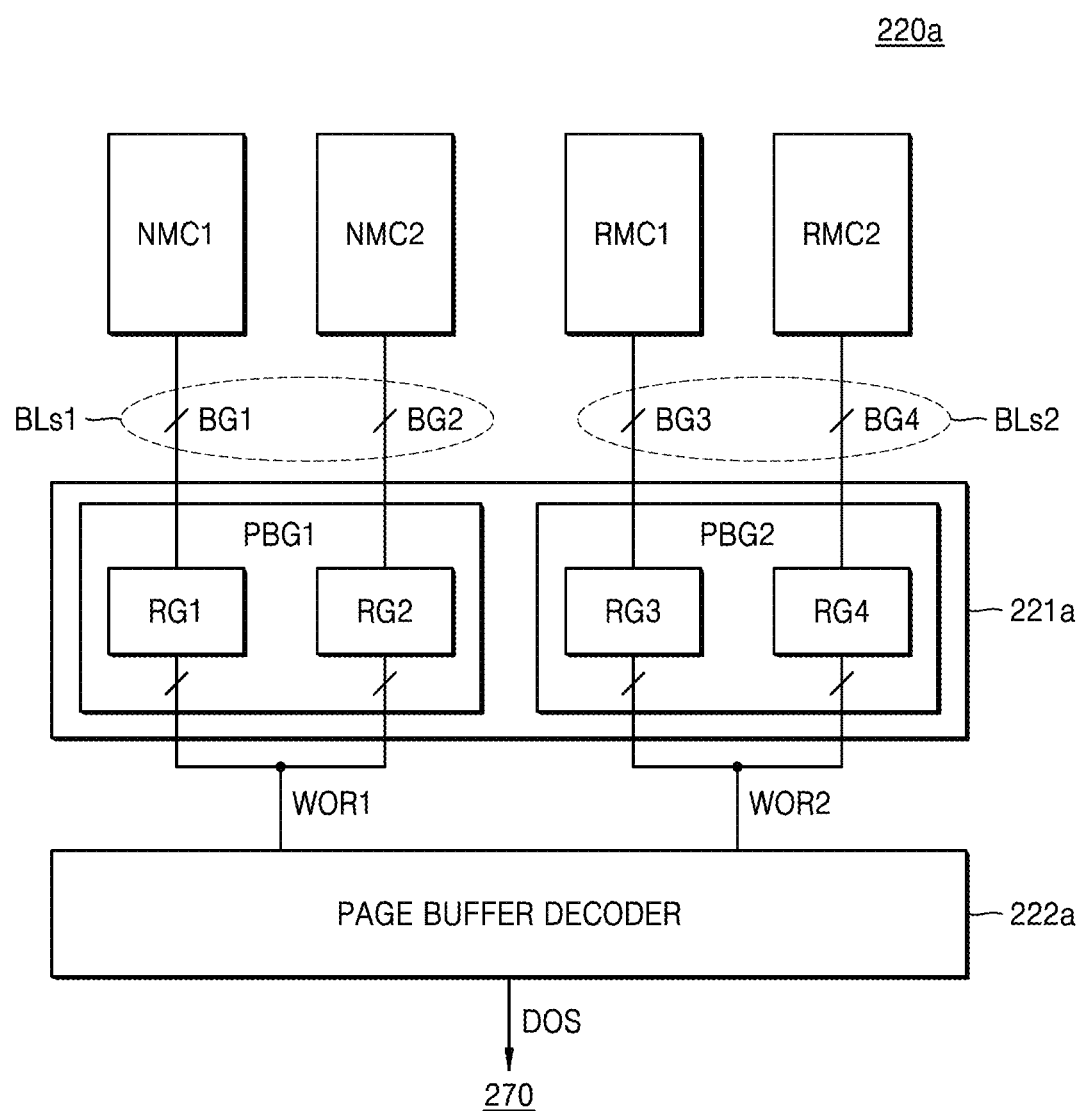
FIG. 4 is a block diagram showing some example embodiments of a page buffer unit in FIG. 2.

FIG. 4 is a block diagram showing some example embodiments of the page buffer unit 220 in FIG. 2. Referring to FIG. 4, a page buffer unit 220a may include a page buffer circuit 221a and a page buffer decoder 222a. The page buffer circuit 221a may include a first page buffer group PBG1 and a second page buffer group PBG2. Each of the first and second page buffer groups PBG1 and PBG2 may include a plurality of page buffers. For example, the number of page buffers of the first page buffer group PBG1 may be the same as the number of page buffers of the second page buffer group PBG2; however, example embodiments are not limited thereto.

The first page buffer group PBG1 may be connected to first normal memory cells NMC1 and second normal memory cells NMC2 through first bit lines BLs1. The first and second normal memory cells NMC1 and NMC2 may be in/located within the main area of the memory cell array 210. The first bit lines BLs1 may be divided into a first bit line group BG1 connected to the first normal memory cells NMC1 and a second bit line group BG2 connected to the second normal memory cells NMC2. The page buffers of the first page buffer group PBG1 may be respectively connected to the first bit lines BLs1. Each page buffer may store data read from normal memory cells connected to a corresponding bit line and/or store data to be programmed to the normal memory cells connected to the corresponding bit line.

The page buffers of the first page buffer group PBG1 may be divided into a first repair group RG1 and a second repair group RG2. For example, the first repair group RG1 may include the same number of page buffers as the second repair group RG2; however, example embodiments are not limited thereto. The first repair group RG1 may be connected to the first normal memory cells NMC1 through the first bit line group BG1, and the second repair group RG2 may be connected to the second normal memory cells NMC2 through the second bit line group BG2.

The first repair group RG1 and the second repair group RG2 may be connected to the page buffer decoder 222a through the first wired OR line WOR1. For example, the first repair group RG1 may output data, which is read from the first normal memory cells NMC1, through the first wired OR line WOR1. The second repair group RG2 may output data, which is read from the second normal memory cells NMC2, through the first wired OR line WOR1.

The second page buffer group PBG2 may be connected to first redundant memory cells RMC1 and second redundant memory cells RMC2 through second bit lines BLs2. The first and second redundant memory cells RMC1 and RMC2 may be in/located within the spare area of the memory cell array 210. The second bit lines BLs2 may be divided into a third bit line group BG3 connected to the first redundant memory cells RMC1 and a fourth bit line group BG4 connected to the second redundant memory cells RMC2. The page buffers of the second page buffer group PBG2 may be respectively connected to the second bit lines BLs2. Each page buffer may store data read from redundant memory cells connected to a corresponding bit line and/or may store data to be programmed to the redundant memory cells connected to the corresponding bit line.

The page buffers of the second page buffer group PBG2 may be divided into a third repair group RG3 and a fourth repair group RG4. For example, the third repair group RG3 may include the same number of page buffers as the fourth repair group RG4; however, example embodiments are not limited thereto. The third repair group RG3 may be connected to the first redundant memory cells RMC1 through the third bit line group BG3, and the fourth repair group RG4 may be connected to the second redundant memory cells RMC2 through the fourth bit line group BG4.

The third repair group RG3 and the fourth repair group RG4 may be connected to the page buffer decoder 222a through the second wired OR line WOR2. For example, the third repair group RG3 may output data, which is read from the first redundant memory cells RMC1, through the second wired OR line WOR2. The fourth repair group RG4 may output data, which is read from the second redundant memory cells RMC2, through the second wired OR line WOR2.

As described above, the first through fourth bit line groups BG1 through BG4 may have the same number of bit lines as one another, and the first through fourth repair groups RG1 through RG4 may have the same number of page buffers as one another.

According to some example embodiments, memory cells corresponding to a column repair unit may correspond to a repair group. For example, the first redundant memory cells RMC1 connected to the third repair group RG3 through the third bit line group BG3 may be referred to or correspond to a column repair unit or chunk. In this case, according to some example embodiments, the number of redundant memory cells corresponding to a column repair unit may be less than the number of redundant memory cells corresponding to a page buffer group. In configuring a specific (or, alternatively, predetermined) number of column repair units, the number of redundant memory cells required or used according to a column repair unit corresponding to a repair group may be less than the number of redundant memory cells required according to a column repair unit corresponding to a page buffer group. Therefore, according to some example embodiments, the spare area including redundant memory cells in the memory device 200 is reduced, and accordingly, the chip size of the memory device 200 may also be reduced.

The page buffer decoder 222a may receive data from the first page buffer group PBG1 through the first wired OR line WOR1 and may receive data from the second page buffer group PBG2 through the second wired OR line WOR2. For example, the data received through the first and second wired OR lines WOR1 and WOR2 may include data, which is read from memory cells based on a program verify voltage to determine a program pass or program fail during a program operation. For example, the page buffer decoder 222a may sequentially receive data from the page buffers of the first repair group RG1 through the first wired OR line WOR1 and may sequentially receive data from the page buffers of the second repair group RG2 through the first wired OR line WOR1.

The page buffer decoder 222a may provide data, which is received through the first and second wired OR lines WOR1 and WOR2, to the MBC 270 as the decoder output signal DOS, based on column repair information. For example, when the first normal memory cells NMC1 are replaced/readdressed with the first redundant memory cells RMC1 according to column repair, data received from the first repair group RG1 through the first wired OR line WOR1 may not be output, and instead data received from the third repair group RG3 through the second wired OR line WOR2 may be output.

Although an example in which bit lines connected to a page buffer group are divided into two bit line groups is described with reference to FIG. 4, example embodiments are not limited thereto. For example, bit lines connected to a page buffer group may be divided into at least three bit line groups. In this case, the page buffer group may be divided into at least three repair groups. When the number of repair groups, into which a page buffer group is divided, increases, the number of redundant memory cells corresponding to a column repair unit may decrease. Hereinafter, for convenience of description, example embodiments will be described based on the example, in which bit lines connected to a page buffer group is divided into two bit line groups.

Figure 5:
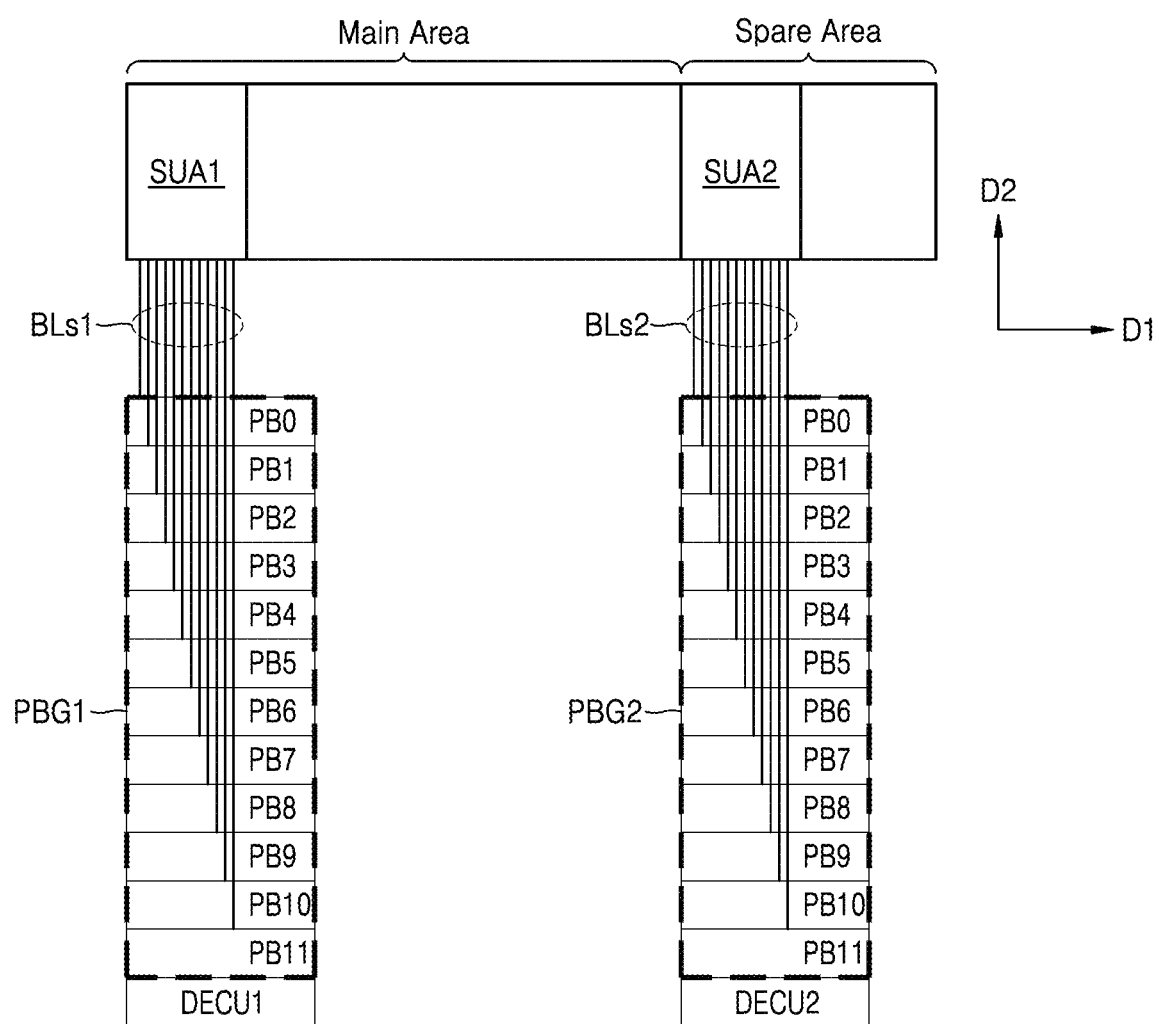
FIG. 5 is a diagram of examples of page buffer groups in FIG. 4.

FIG. 5 is a diagram of examples of page buffer groups in FIG. 4. Referring to FIGS. 4 and 5, each of the first and second page buffer groups PBG1 and PBG2 may include first through twelfth page buffers PB0 through PB11. The first through twelfth page buffers PB0 through PB11 may be arranged in a line, e.g. collinearly, in the second direction D2, in which bit lines, e.g., the first bit lines BLs1 and the second bit lines BLs2, extend, as shown in FIG. 5. The first and second page buffer groups PBG1 and PBG2 may be arranged in parallel with each other in the first direction D1 (e.g., a direction in which a word line extends), wherein the first direction D1 is perpendicular to the second direction D2. For example, the first page buffer group PBG1 may be separated from the second page buffer group PBG2 in the first direction D1. Although twelve page buffers PB0 through PB11 are illustrated, example embodiments are not limited thereto.

The first through twelfth page buffers PB0 through PB11 of the first page buffer group PBG1 may be connected to normal memory cells, which are arranged in a first sub area SUA1 of the main area, through the first bit lines BLs1. In this case, twelve page buffers, e.g., the first through twelfth page buffers PB0 through PB11, of the first page buffer group PBG1 may be respectively connected to twelve first bit lines BLs1. For example, the first page buffer PB0 of the first page buffer group PBG1 may be connected to one of the first bit lines BLs1, and the second page buffer PB1 of the first page buffer group PBG1 may be connected to another one of the first bit lines BLs1.

The first through twelfth page buffers PB0 through PB11 of the second page buffer group PBG2 may be connected to redundant memory cells, which are arranged in a second sub area SUA2 of the spare area, through the second bit lines BLs2. In this case, twelve page buffers, e.g., the first through twelfth page buffers PB0 through PB11, of the second page buffer group PBG2 may be respectively connected to twelve second bit lines BLs2. For example, the first page buffer PB0 of the second page buffer group PBG2 may be connected to one of the second bit lines BLs2, and the second page buffer PB1 of the second page buffer group PBG2 may be connected to another one of the second bit lines BLs2.

A first page buffer decoder unit DECU1 may be provided in correspondence to the first page buffer group PBG1, and a second page buffer decoder unit DECU2 may be provided in correspondence to the second page buffer group PBG2. For example, the first page buffer decoder unit DECU1 may be provided above or below the first page buffer group PBG1 in the second direction D2, and the second page buffer decoder unit DECU2 may be provided above or below the second page buffer group PBG2 in the second direction D2. The first and second page buffer decoder units DECU1 and DECU2 may be included in the page buffer decoder 222a in FIG. 4. In some example embodiments, data output from the first through twelfth page buffers PB0 through PB11 of each of the first and second page buffer groups PBG1 and PBG2 may be transmitted to a corresponding page buffer decoder unit. Each of the first and second page buffer decoder units DECU1 and DECU2 may control output of data based on column repair information.

As described above, the page buffer groups of the page buffer circuit 221a may include the same number of page buffers as each other. The page buffers of each page buffer group may be arranged in a line/be arranged collinearly in the second direction D2, in which bit lines extend. Although a page buffer group includes twelve page buffers in FIG. 5, example embodiments are not limited thereto. For example, a page buffer group may include ten or eight page buffers, or more than twelve page buffers. In this case, the number of bit lines connected to a page buffer group may vary with the number of page buffers. For example, when a page buffer group includes ten page buffers, the number of bit lines connected to the page buffer group may be ten, and the number of bit lines of each bit line group may be five.

Figure 6:
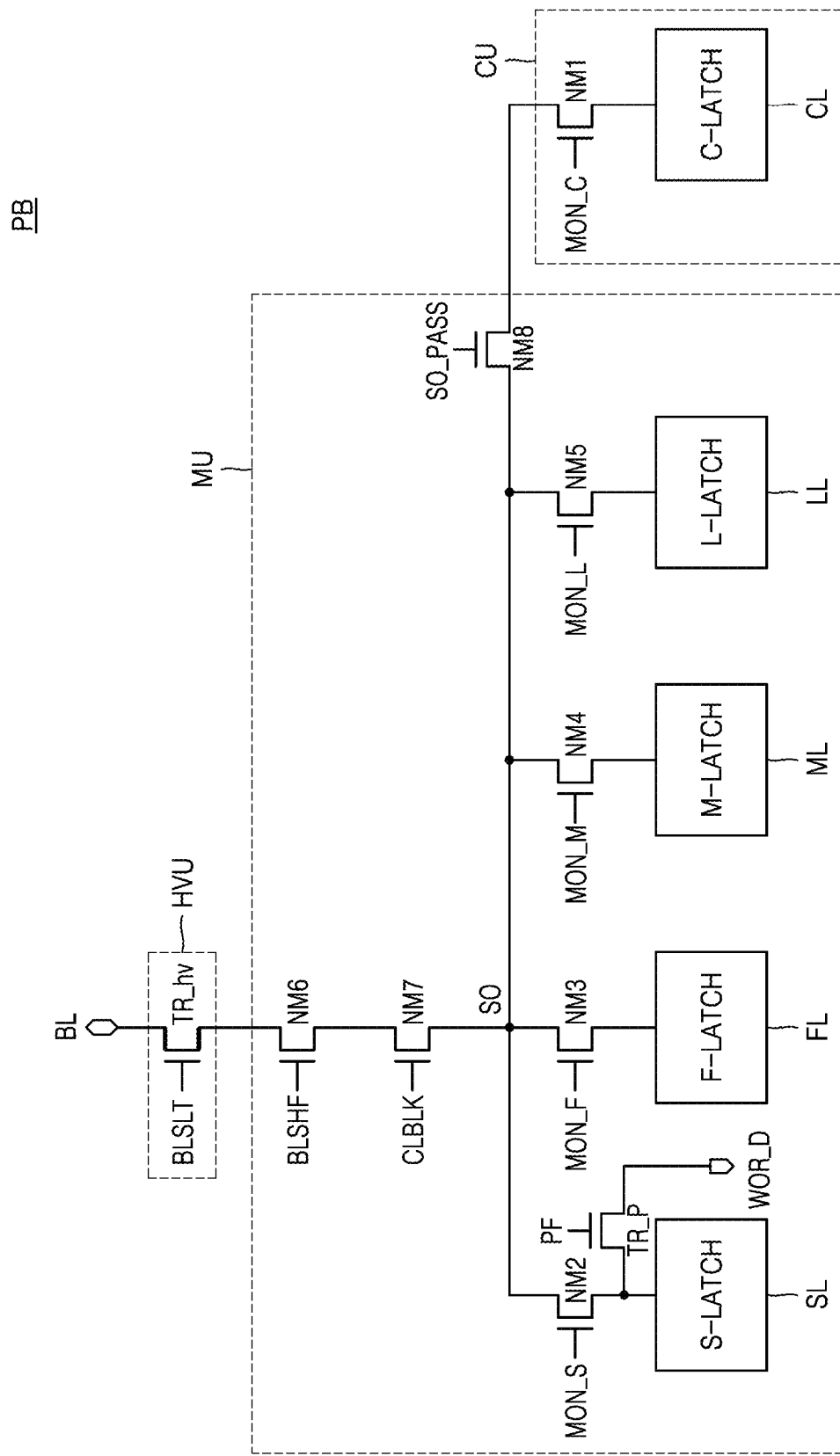
FIG. 6 is an example circuit diagram of a page buffer in FIG. 5.

FIG. 6 is an example circuit diagram of a page buffer in FIG. 5. Referring to FIG. 6, a page buffer PB may correspond to one of the first through twelfth page buffers PB0 through PB11 in FIG. 5. The page buffer PB may include a high-voltage unit HVU, a main unit MU, and a cache unit CU. Although FIG. 6 illustrates a number of transistors as NMOS transistors, example embodiments are not limited thereto, and at least one transistor included in any one of the page buffers PB0 to PB11 may be PMOS transistors.

The high-voltage unit HVU may include a bit line selection transistor TR_hv, which is connected to a bit line BL and driven by a bit line selection signal BLSLT. The bit line selection transistor TR_hv may include a high-voltage transistor to reduce the influence of a high voltage (e.g., an erase voltage) and thus may be arranged in a well region differently from the main unit MU.

The cache unit CU may include a cache latch (C-latch) CL. The C-latch CL may be connected to a data I/O line. Accordingly, the cache unit CU may be adjacent to the data I/O line. For example, the main unit MU may be separated from the cache unit CU. The cache unit CU may further include a first transistor NM1. The first transistor NM1 may be driven according to a cache monitoring signal MON_C.

The main unit MU may include main transistors of the page buffer PB. The main unit MU may include a sensing latch (S-latch) SL, a force latch (F-latch) FL, a high-order bit latch (M-latch) ML, and a low-order bit latch (L-latch) LL. The S-latch SL may store a result of sensing data stored in a memory cell and/or a result of sensing a threshold voltage of the memory cell in a read operation or a program verify operation. The S-latch SL may also be used to apply a program bit line voltage or a program-inhibit voltage to the bit line BL in a program operation. The F-latch FL may be used to improve threshold voltage variation in a program operation. In detail, the F-latch FL stores force data. The force data may be initially set to "1" and then inverted to "0" when the threshold voltage of a memory cell enters a forcing region that falls short of, e.g. is less than, a target region. The force data may be used to control a bit line voltage and to narrow program threshold voltage variation in a program operation.

The M-latch ML, the L-latch LL, and the C-latch CL may be used to store externally input data during a program operation. For example, when 3-bit data is programmed to a single memory cell, three bits in the 3-bit data may be respectively stored in the M-latch ML, the L-latch LL, and the C-latch CL. However, example embodiments are not limited thereto. Three bits in 3-bit data received through the C-latch CL may be respectively stored in the F-latch FL, the M-latch ML, and the L-latch LL. Until programming of a memory cell is completed, the M-latch ML, the L-latch LL, and the C-latch CL may retain data stored therein. Alternatively or additionally, the C-latch CL may receive data, which is read from a memory cell, from the S-latch SL and output the data to the outside of the page buffer PB through a data I/O line in a read operation.

The main unit MU may further include second through fifth transistors NM2 through NM5. The second transistor NM2 may be connected between a sensing node SO and the S-latch SL and driven by a sensing monitoring signal MON_S. The third transistor NM3 may be connected between the sensing node SO and the F-latch FL and driven by a forcing monitoring signal MON_F. The fourth transistor NM4 may be connected between the sensing node SO and the M-latch ML and driven by a high-order bit monitoring signal MON_M. The fifth transistor NM5 may be connected between the sensing node SO and the L-latch LL and driven by a low-order bit monitoring signal MON_L.

The main unit MU may further include a sixth transistor NM6 and a seventh transistor NM7, which are connected in series between the bit line selection transistor TR_hv and the sensing node SO. The sixth transistor NM6 may be driven by a bit line shut-off signal BLSHF, and the seventh transistor NM7 may be driven by a bit line connection control signal CLBLK. The main unit MU may further include an eighth transistor NM8 connected to the sensing node SO. The eighth transistor NM8 may be referred to as a pass transistor and driven by a pass control signal SO_PASS.

The main unit MU may further include a pass/fail transistor TR_P connected to a node between the second transistor NM2 and the S-latch SL. The pass/fail transistor TR_P may be driven by a pass/fail control signal PF. An end of the pass/fail transistor TR_P may be connected to the node between the second transistor NM2 and the S-latch SL, and another end of the pass/fail transistor TR_P may be connected to a wired OR terminal WOR_D. The wired OR terminal WOR_D may be connected to a wired OR terminal of another page buffer of a page buffer group, which includes the page buffer PB, through a wired OR line. For example, as shown in FIG. 4, respective wired OR terminals of page buffers of the first page buffer group PBG1 may be connected to each other through the first wired OR line WOR1.

In some example embodiments, the pass/fail transistor TR_P may be used to determine a program pass or program fail during a program operation. For example, when data to be programmed is input through the C-latch CL, the data may be dumped from the C-latch CL to the F-latch FL, the M-latch ML, or the L-latch LL. In this case, the first transistor NM1 and the eighth transistor NM8 may be turned on, allowing current to flow between two terminals, and the third, fourth, or fifth transistor NM3, NM4, or NM5 corresponding to a latch, to which the data is dumped, may be turned on, allowing current to flow between two terminals. The dumped data may be programmed to a selected memory cell among the memory cells connected to the bit line BL. In this case, the sixth transistor NM6, the seventh transistor NM7, and the bit line selection transistor TR_hv may be turned on to allow current to flow between terminals. When the threshold voltage of the selected memory cell is changed from an erased state to a programmed state according to a program operation, a read operation may be performed on the programmed data to determine a program pass or fail. For example, the read operation may be performed based on a program verify voltage. When the program operation is normally performed (e.g., when the selected memory cell is an off-cell), the voltage of the sensing node SO may be maintained in a precharge state (i.e., a logic high level) according to the read operation. When the program operation is not normally performed (e.g., when the selected memory cell is an on-cell), the voltage of the sensing node SO may be changed to a logic low level. In other words, the read data may be sensed through the sensing node SO. When the program operation is not normally performed, the read data may have a fail bit. The data read through the sensing node SO may be stored in the S-latch SL and/or output to the wired OR terminal WOR_D through the pass/fail transistor TR_P. In this case, the second transistor NM2 and the pass/fail transistor TR_P may be respectively turned on by the sensing monitoring signal MON_S and the pass/fail control signal PF. The data output through the wired OR terminal WOR_D may be transmitted to the MBC 270 through the page buffer decoder 222a, as described above with reference to FIG. 4.

Figure 7:
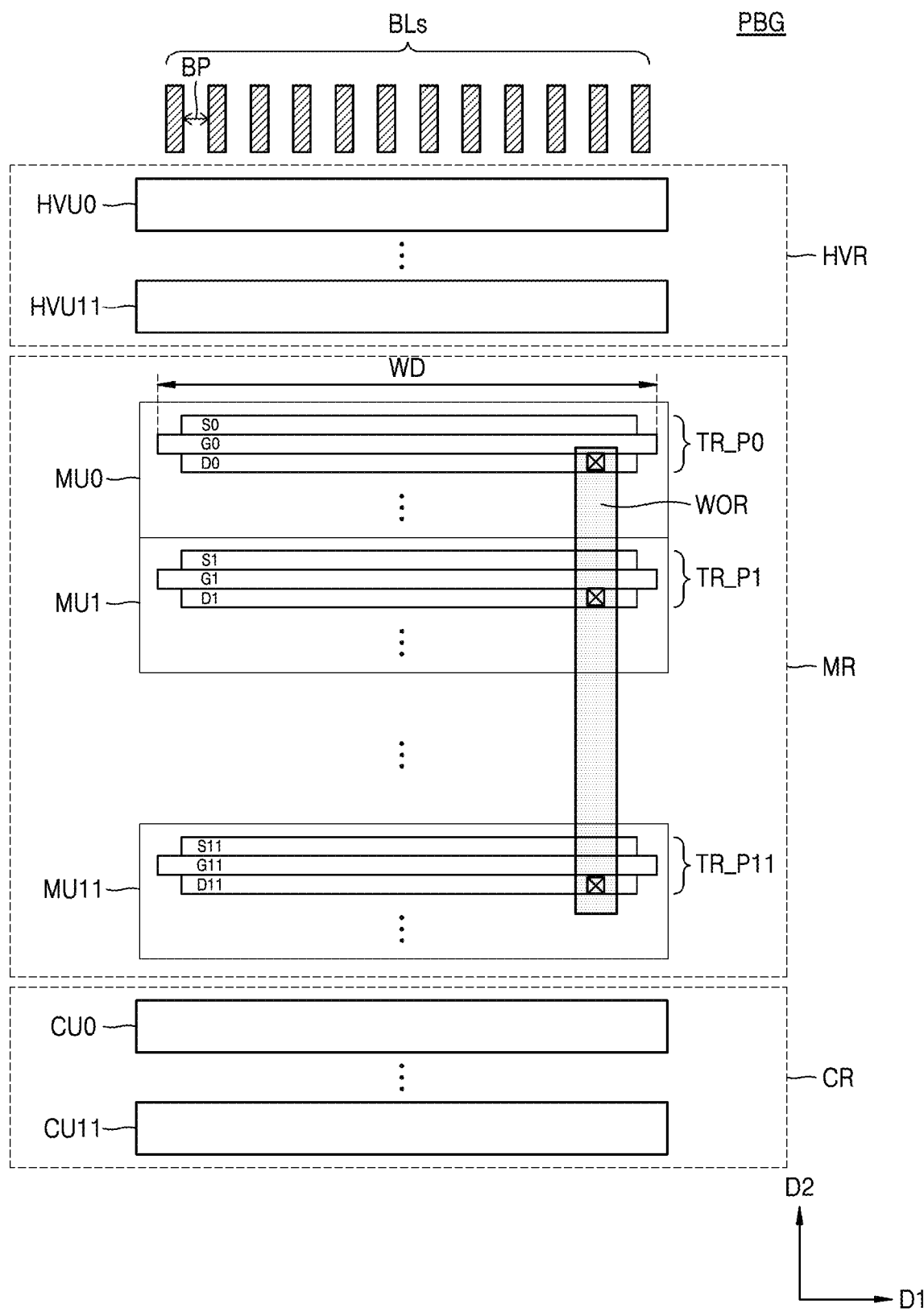
FIG. 7 is a plan view of a page buffer group according to some example embodiments.

FIG. 7 is a plan view of a page buffer group according to some example embodiments. Referring to FIG. 7, a page buffer group PBG may correspond to the first or second page buffer group PBG1 or PBG2, which includes the first through twelfth page buffers PB0 through PB11 in FIG. 5.

The first through twelfth page buffers PB0 through PB11 may include first through twelfth high-voltage units HVU0 through HVU11, respectively, first through twelfth main units MU0 through MU11, respectively, and first through twelfth cache units CU0 through CU11, respectively, as described above with reference to FIG. 6. For example, the first page buffer PB0 may include the first high-voltage unit HVU0, the first main unit MU0, and the first cache unit CU0. The first through twelfth high-voltage units HVU0 through HVU11, the first through twelfth main units MU0 through MU11, and the first through twelfth cache units CU0 through CU11 may be arranged collinearly in a line in the second direction D2. The first through twelfth high-voltage units HVU0 through HVU11 may be arranged in a high-voltage unit region HVR, the first through twelfth main units MU0 through MU11 may be arranged in a main unit region MR adjacent to the high-voltage unit region HVR, and the first through twelfth cache units CU0 through CU11 may be arranged in a cache unit region CR adjacent to the main unit region MR. Although the high-voltage unit region HVR is separated from the main unit region MR in FIG. 7, example embodiments are not limited thereto. For example, a high-voltage unit may be arranged among the first through twelfth main units MU0 through MU11. In this case, the first through twelfth high-voltage units HVU0 through HVU11 may be arranged in the main unit region MR.

The first through twelfth main units MU0 through MU11 may respectively include first through twelfth pass/fail transistors TR_P0 through TR_P11. The first through twelfth pass/fail transistors TR_P0 through TR_P11 may be arranged collinearly in a line in the second direction D2. Each of the first through twelfth main units MU0 through MU11 may further include various transistors such as various PMOS transistors and/or various NMOS transistors in FIG. 6 in addition to the pass/fail transistor TR_P. In this case, transistors included in each of the first through twelfth main units MU0 through MU11 may be arranged collinearly in a line in the second direction D2. Although the pass/fail transistor TR_P of each of the first through twelfth main units MU0 through MU11 is adjacent to the boundary of a corresponding main unit in FIG. 7, the position of the pass/fail transistor TR_P may be variously changed. For example, at least one selected from the various transistors in FIG. 6 may be between the first main unit MU0 and the first pass/fail transistor TR_P0.

Each of the first through twelfth pass/fail transistors TR_P0 through TR_P11 may include a source/source terminal/source electrode, a gate/gate terminal/gate electrode, and a drain/drain terminal/drain electrode. For example, the first pass/fail transistor TR_P0 may include a first source S0, a first gate G0, and a first drain D0. First through twelfth drains D0 through D11 of the respective first through twelfth pass/fail transistors TR_P0 through TR_P11 may be connected to one another through a wired OR line WOR. Accordingly, the first through twelfth pass/fail transistors TR_P0 through TR_P11 of the respective first through twelfth page buffers PB0 through PB11 may be connected to one another through the wired OR line WOR, and each of the first through twelfth page buffers PB0 through PB11 may output data, which is read for determination of a program pass or fail, through the wired OR line WOR. For example, the wired OR line WOR may be connected to each of the first through twelfth pass/fail transistors TR_P0 through TR_P11 through the wired OR terminal WOR_D in FIG. 6.

Although not shown in FIG. 7, each of the first through twelfth high-voltage units HVU0 through HVU11 and the first through twelfth cache units CU0 through CU11 may include at least one transistor, as described above with reference to FIG. 6. In this case, transistors included in each of the first through twelfth high-voltage units HVU0 through HVU11 and the first through twelfth cache units CU0 through CU11 may be arranged in a line in the second direction D2. For example, transistors included in the page buffer group PBG may be arranged in a line in the second direction D2.

A transistor width WD, e.g. an electrical width, of a transistor of the page buffer group PBG may correspond to a gate size or gate width of the transistor. For example, the transistor width WD may correspond to a size of the first gate G0 of the first pass/fail transistor TR_P0 in the first direction D1. The transistor width WD may correspond to a strength of, e.g. an amount of on-current of, a transistor. In some example embodiments, transistors of the page buffer group PBG may have the same transistor width WD as each other and may be arranged in a line in the second direction D2. Accordingly, a size (hereinafter, referred to as a page buffer width) of each of the first through twelfth page buffers PB0 through PB11 through TR_P11 in the first direction D1 may be determined by the transistor width WD. The transistor width WD may vary with process technology. For example, with the development of process technology, the page buffer width may be decreased. However, there may be a limit to decrease the transistor width WD (e.g., the page buffer width).

Twelve bit lines BLs corresponding to the page buffer group PBG may extend in the second direction D2 and may be separated from each other at a certain distance (e.g., a bit line pitch BP) in the first direction D1. In this case, the size of a region, in which the twelve bit lines BLs are arranged in the first direction D1, may correspond to a page buffer width. For example, the size of a region, in which the bit lines BLs are arranged in the first direction D1, may correspond to the transistor width WD. For example, according to the transistor width WD in FIG. 7, the number of bit lines BLs may be determined to be twelve in correspondence to a page buffer width. Accordingly, the page buffer group PBG may include twelve page buffers, i.e., the first through twelfth page buffers PB0 through PB11, in correspondence to twelve bit lines BLs.

Even though with the development of process technology, the bit line pitch BP may be difficult to be decreased because of coupling noise and/or parasitic capacitance and/or the like. Contrarily, the transistor width WD of transistors, e.g. of planar transistors, may vary with the development of process technology. When the transistor width WD is decreased with the development of process technology, the number of bit lines BLs that may be arranged in correspondence to a page buffer width may be decreased. For example, when the transistor width WD in FIG. 7 is decreased, the number of bit lines BLs may be decreased to ten or eight. As described above, when the number of bit lines BLs corresponding to the transistor width WD is changed, the number of page buffers included in the page buffer group PBG may vary with the number of bit lines BLs. For example, the number of bit lines BLs corresponding to the transistor width WD is ten, the page buffer group PBG may include ten page buffers, and the ten page buffers may be arranged in a line in the second direction D2.

In a case where a column repair unit corresponds to the bit lines BLs connected to the page buffer group PBG, when the transistor width WD decreases, the number of bit lines BLs connected to the page buffer group PBG may decrease, and accordingly, the number of redundant memory cells corresponding to the column repair unit may also decrease. However, as described above, there may be a limit to decrease the transistor width WD even though with the development of process technology. Therefore, when column repair is performed in correspondence to the bit lines BLs connected to the page buffer group PBG, there may be a limit to decrease the number of redundant memory cells. For example, when column repair is performed in a column repair unit corresponding to the page buffer group PBG, there may be a limit to decrease the chip size of a memory device. There may be a limit to increase the number of chips on a wafer used in the manufacturing/fabrication of the memory device.

Figure 8:
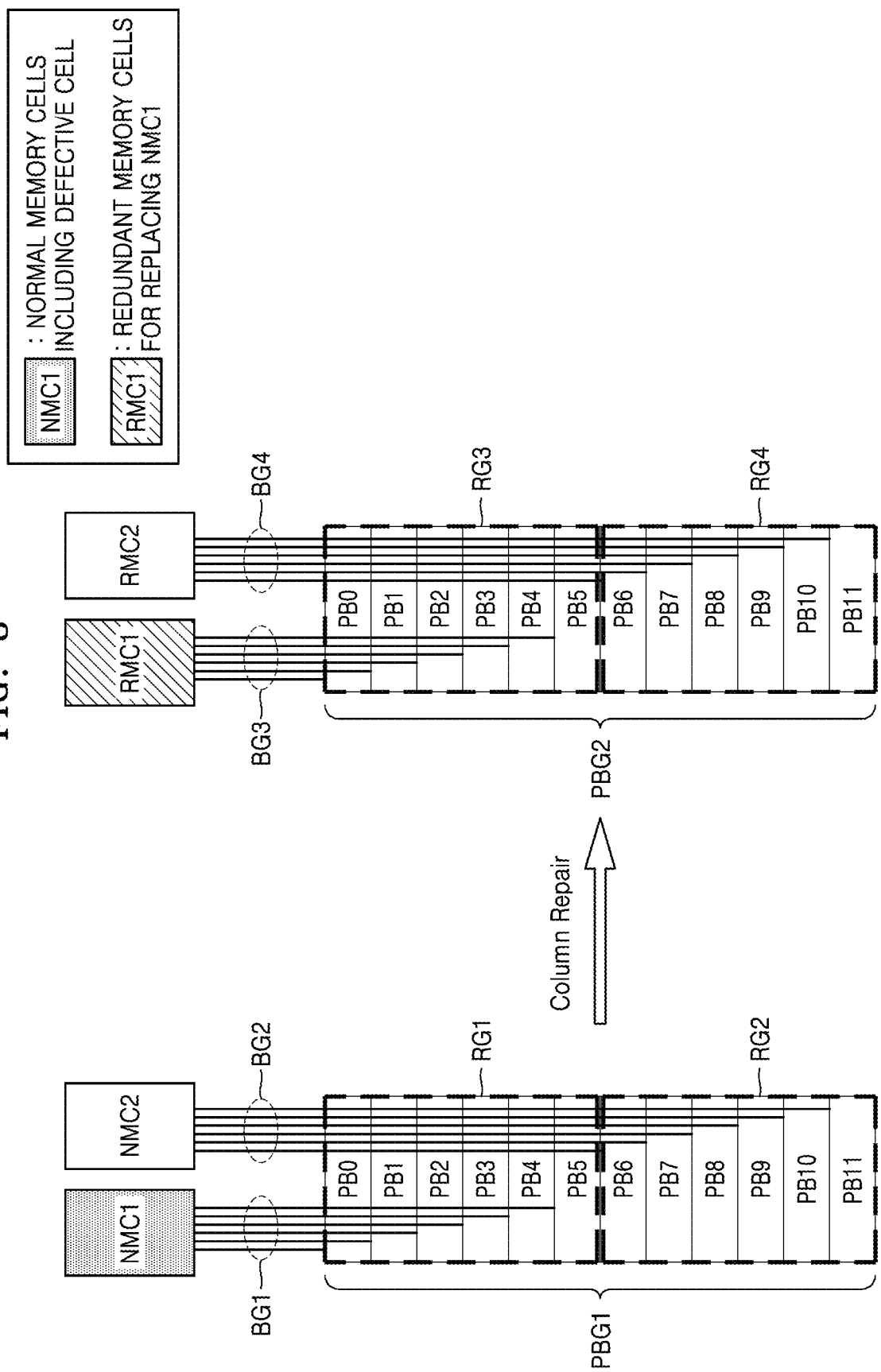
FIG. 8 is a diagram of an example of column repair according to some example embodiments.

FIG. 8 is a diagram of an example of column repair according to some example embodiments. Referring to FIG. 8, each of the first and second page buffer groups PBG1 and PBG2, each including twelve page buffers, e.g., the first through twelfth page buffers PB0 through PB11, may be divided into repair groups, each of which includes six page buffers. For example, the first page buffer group PBG1 may be divided into the first repair group RG1, which includes the first through sixth page buffers PB0 through PB5, and the second repair group RG2, which includes the seventh through twelfth page buffers PB6 through PB11. The second page buffer group PBG2 may be divided into the third repair group RG3, which includes the first through sixth page buffers PB0 through PB5, and the fourth repair group RG4, which includes the seventh through twelfth page buffers PB6 through PB11. The first through fourth repair groups RG1 through RG4 may be respectively connected to the first through fourth bit line groups BG1 through BG4. Accordingly, each of the first through fourth bit line groups BG1 through BG4 may include six bit lines. For example, the first repair group RG1 may be connected to the first normal memory cells NMC1 through the first bit line group BG1, and the third repair group RG3 may be connected to the first redundant memory cells RMC1 through the third bit line group BG3.

As shown in FIG. 8, when at least one of the first normal memory cells NMC1 is determined as a defective cell, the first normal memory cells NMC1 may be replaced with/readdressed to the first redundant memory cells RMC1 according to column repair. In this case, the second normal memory cells NMC2, which are connected to the second repair group RG2 through the second bit line group BG2, may be normally used.

As described above, according to some example embodiments, a column repair unit may correspond to bit lines (e.g., six bit lines) connected to a repair group. In this case, compared with column repair performed in a column repair unit corresponding to bit lines (e.g., twelve bit lines) connected to a page buffer group, necessary redundant memory cells may be decreased. For example, when column repair is performed in a column repair unit corresponding to a repair group, the chip size of a memory device may be reduced, and/or a number of die on a wafer may be increased, which may increase productivity.

FIG. 9 is a diagram of an example of column repair mapping information involved in the column repair of FIG. 8. Referring to FIG. 9, when column repair is performed as shown in FIG. 8, a column address, for example, a defect address C_ADDR_BG1 indicating the first bit line group BG1 may be mapped to a column address, for example, a repair address C_ADDR_BG3 indicating the third bit line group BG3. For example, the repair address C_ADDR_BG3 corresponding to the defect address C_ADDR_BG1 may be stored in a column repair table CRT.

For example, column repair mapping information of the column repair table CRT may be stored in the memory cell array 210 in FIG. 2. In this case, the control logic circuit 240 may read the column repair mapping information from the memory cell array 210 in the initialization of the memory device 200 and control the page buffer circuit 221a and the page buffer decoder 222a according to the column repair mapping information.

Figure 10:
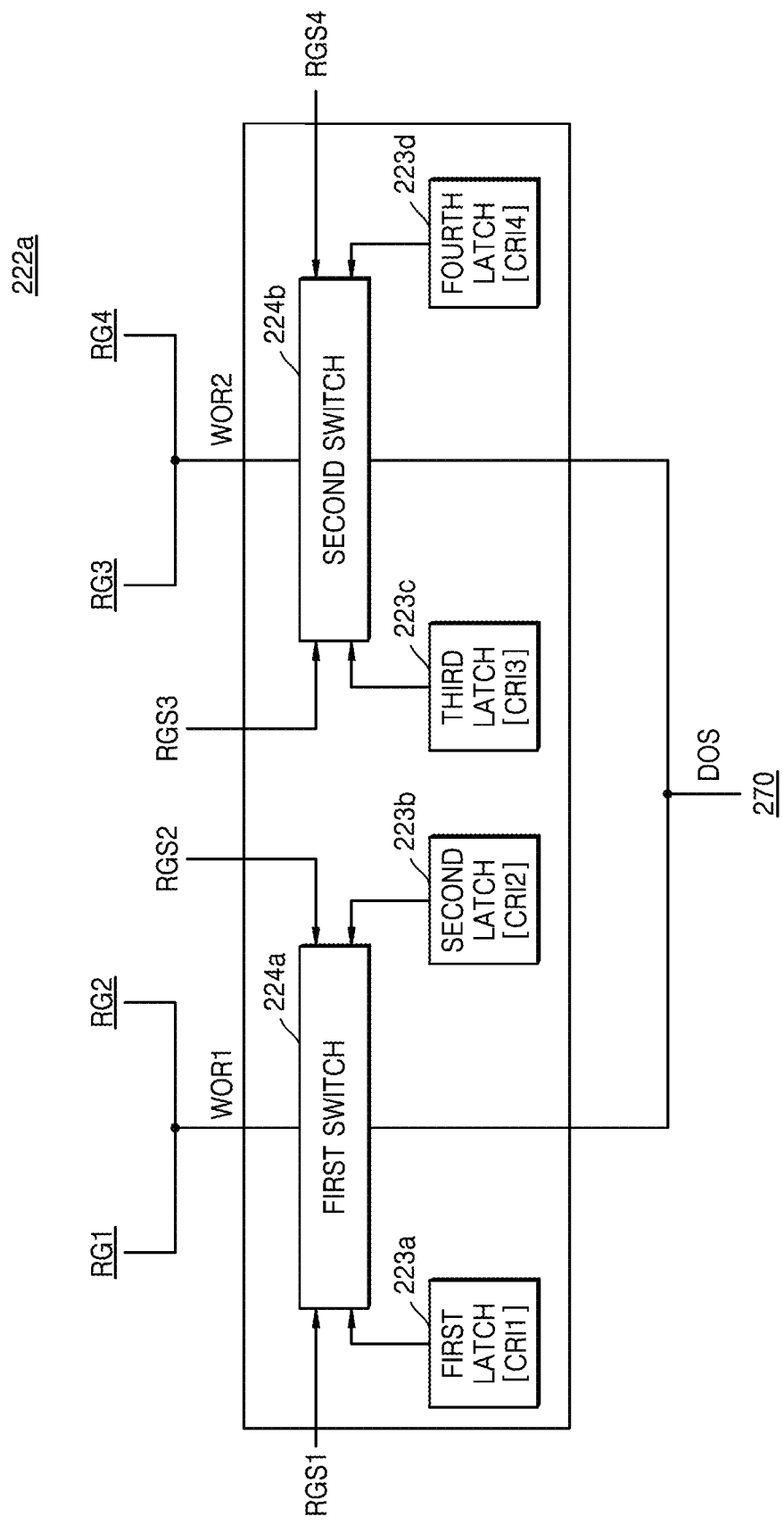
FIG. 10 is an example block diagram of a pager buffer decoder in FIG. 4.

FIG. 10 is an example block diagram of the pager buffer decoder 222a in FIG. 4. Referring to FIG. 10, the page buffer decoder 222a may include first through fourth latches 223a through 223d and first and second switches 224a and 224b. The first through fourth latches 223a through 223d and the first and second switches 224a and 224b may correspond to the first and second page buffer decoder units DECU1 and DECU2 in FIG. 5.

The first through fourth latches 223a through 223d may respectively store first column repair information CRI1, second column repair information CRI2, third column repair information CRI3, and fourth column repair information CRI4. For example, the first through fourth column repair information CRI1, CRI2, CRI3, and CRI4 may be respectively stored in the first through fourth latches 223a through 223d in the initialization of the memory device 200. The first through fourth column repair information CRI1, CRI2, CRI3, and CRI4 stored in the first through fourth latches 223a through 223d may respectively correspond to first through fourth repair groups RG1 through RG4 (e.g., the first through fourth bit line groups BG1 through BG4). For example, when a page buffer group in FIG. 4 is divided into at least three repair groups, the number of latches of the page buffer decoder 222a may increase according to the number of repair groups.

Column repair information may indicate whether column repair has been performed on a corresponding repair group. In some example embodiments, when column repair has been performed on a repair group connected to normal memory cells, column repair information may include a disable value (e.g., a low or logic low value). When column repair has not been performed on a repair group connected to normal memory cells, column repair information may include an enable value (e.g., a high or logic high value). When column repair has been performed on a repair group connected to redundant memory cells, column repair information may include an enable value (e.g., a high or logic high value). When column repair has not been performed on a repair group connected to redundant memory cells, column repair information may include a disable value (e.g., a low or logic low value). For example, when normal memory cells corresponding to the first repair group RG1 are replaced with redundant memory cells corresponding to the third repair group RG3, the first column repair information CRI1 may include a disable value (e.g., a low or logic low value) and the third column repair information CRI3 may include an enable value (e.g., a high or logic high value).

The first switch 224a may receive data from the first repair group RG1 and the second repair group RG2 through the first wired OR line WOR1. For example, the first switch 224a may sequentially receive data from page buffers of the first repair group RG1 and then sequentially receive data from page buffers of the second repair group RG2. For example, the received data may include data, which has been read from normal memory cells connected to the first and second repair groups RG1 and RG2 to determine a program pass or program fail in a program operation.

The first switch 224a may output the received data based on first and second repair group selection signals RGS1 and RGS2 and the first and second column repair information CRI1 and CRI2. For example, the first switch 224a may output data, which is received through the first wired OR line WOR1, when the first repair group selection signal RGS1 is in an enabled state (e.g., a logic high level) and the first column repair information CRI1 includes an enable value (e.g., a high value). The first switch 224a may output data, which is received through the first wired OR line WOR1, when the second repair group selection signal RGS2 is in an enabled state (e.g., a logic high level) and the second column repair information CRI2 includes an enable value (e.g., a logic high value).

The second switch 224b may receive data from the third repair group RG3 and the fourth repair group RG4 through the second wired OR line WOR2. For example, the second switch 224b may sequentially receive data from page buffers of the third repair group RG3 and then sequentially receive data from page buffers of the fourth repair group RG4. For example, the received data may include data, which has been read from normal memory cells connected to the third and fourth repair groups RG3 and RG4 to determine a program pass or fail in a program operation.

The second switch 224b may output the received data based on third and fourth repair group selection signals RGS3 and RGS4 and the third and fourth column repair information CRI3 and CRI4. For example, the second switch 224b may output data, which is received through the second wired OR line WOR2, when the third repair group selection signal RGS3 is in an enabled state (e.g., a logic high level) and the third column repair information CRI3 includes an enable value (e.g., a high value). The second switch 224b may output data, which is received through the second wired OR line WOR2, when the fourth repair group selection signal RGS4 is in an enabled state (e.g., a logic high level) and the fourth column repair information CRI4 includes an enable value (e.g., a high value).

Data output through the first switch 224a and the second switch 224b may be provided to the MBC 270 as the decoder output signal DOS. Accordingly, the MBC 270 may calculate a fail bit count based on the decoder output signal DOS.

Figure 11:
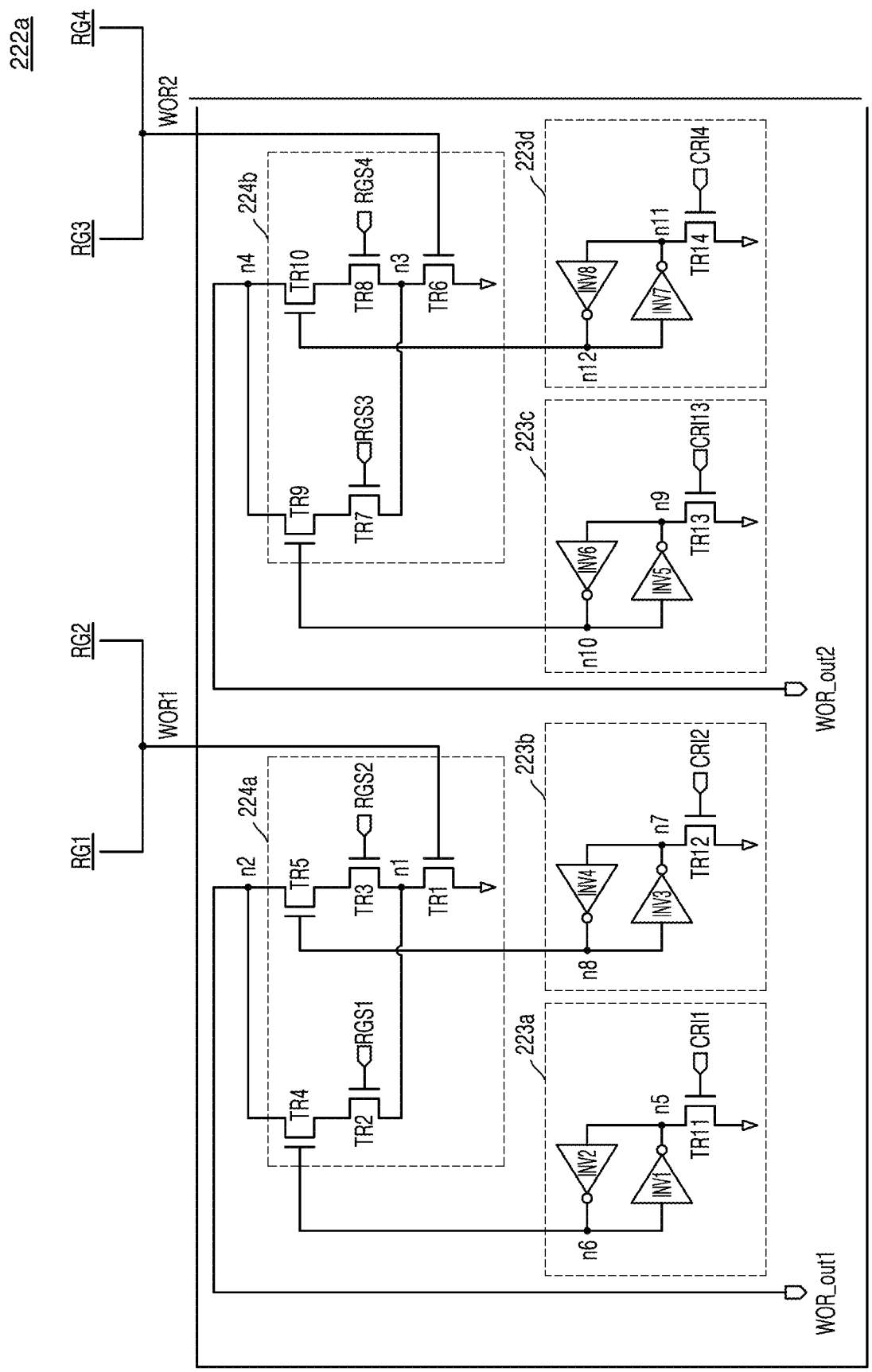
FIG. 11 is an example circuit diagram of the page buffer decoder of FIG. 10.

FIG. 11 is an example circuit diagram of the page buffer decoder 222a of FIG. 10. Referring to FIG. 11, the first switch 224a may include first through fifth transistors TR1 through TR5. The second switch 224b may include sixth through tenth transistors TR6 through TR10. The first latch 223a may include an eleventh transistor TR11 and first and second inverters INV1 and INV2, and the second latch 223b may include a twelfth transistor TR12 and third and fourth inverters INV3 and INV4. The third latch 223c may include a thirteenth transistor TR13 and fifth and sixth inverters INV5 and INV6, and the fourth latch 223d may include a fourteenth transistor TR14 and seventh and eighth inverters INV7 and INV8. As shown in FIG. 11, the configuration of the first switch 224a may be the same or substantially the same as that of the second switch 224b, and the configuration of the first and second latches 223a and 223b may be the same or substantially the same as that of the third and fourth latches 223c and 223d. Hereinafter, for convenience of description, the circuits of the page buffer decoder 222a will be described on the basis of the first switch 224a and the first and second latches 223a and 223b.

In the first and second latches 223a and 223b, the first column repair information CRI1 may be input to a gate terminal of the eleventh transistor TR11 and the second column repair information CRI2 may be input to a gate terminal of the twelfth transistor TR12. The first column repair information CRI1 may be stored by the first and second inverters INV1 and INV2, and the second column repair information CRI2 may be stored by the third and fourth inverters INV3 and INV4. The first and second column repair information CRI1 and CRI2 may be provided to the first switch 224a. For example, when the first column repair information CRI1 includes an enable value (e.g., a logic high value), the eleventh transistor TR11 may be turned on and a fifth node n5 in a precharge state may be changed to a low level. In this case, a sixth node n6 comes to be at a high level, and accordingly, the first column repair information CRI1 including the enable value (e.g., a logic high value) may be provided to the first switch 224a. For example, the first column repair information CRI1 includes a disable value (e.g., a logic low value), the eleventh transistor TR11 may be turned off, and the fifth node n5 in a precharge state may be maintained at a high level. In this case, because the sixth node n6 is maintained at a low level, the first column repair information CRI1 including the disable value (e.g., a logic low value) may be provided to the first switch 224a.

A first node n1 of the first switch 224a may be maintained in a precharge state (e.g., at a high level) or changed to a low level according to data, which is received from one of page buffers of the first and second repair groups RG1 and RG2 through the first wired OR line WOR1. For example, when data having a low value is received, the first transistor TR1 may be turned off, and accordingly, the first node n1 may be maintained at the precharge state. For example, when data having a high value is received, the first transistor TR1 may be turned on, and accordingly, the first node n1 may be changed to the low level. In other words, the voltage level of the first node n1 may vary with data received through the first wired OR line WOR1. The first repair group selection signal RGS1 may be input to the gate terminal of the second transistor TR2, and the second repair group selection signal RGS2 may be input to the gate terminal of the third transistor TR3. When the second and fourth transistors TR2 and TR4 or the third and fifth transistors TR3 and TR5 are turned on, the voltage level of a second node n2 may vary with the voltage level of the first node n1. For example, the second and fourth transistors TR2 and TR4 may be turned on in response to the first repair group selection signal RGS1 in an enabled state (e.g., at a logic high level) and the first column repair information CRI1 having a high value. Accordingly, the data received through the first wired OR line WOR1 may be output to a first wired OR output terminal WOR_out1.

The first wired OR output terminal WOR_out1 may be connected to a second wired OR output terminal WOR_out2 through a data line, through which the decoder output signal DOS is transmitted, as shown in FIG. 10. Accordingly, data output through the first and second wired OR output terminals WOR_out1 and WOR_out2 may be provided to the MBC 270 as the decoder output signal DOS.

Figure 12:
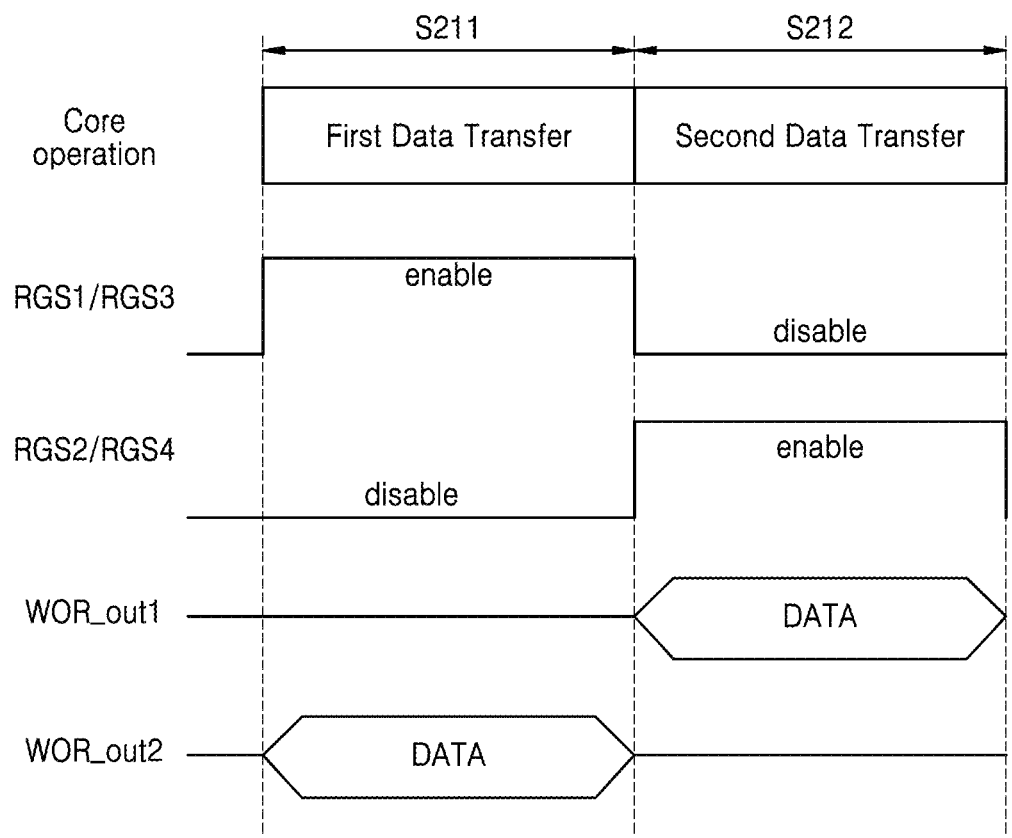
FIG. 12 is a timing diagram for describing an operation of the page buffer decoder of FIG. 11.

FIG. 12 is a timing diagram for describing an operation of the page buffer decoder 222a of FIG. 11. In detail, FIG. 12 shows an example, in which data is output from the page buffer decoder 222a according to column repair, by which the first normal memory cells NMC1 are replaced with the first redundant memory cells RMC1 as described above with reference to FIG. 8. For example, the first through fourth latches 223a through 223d may respectively store the first through fourth column repair information CRI1 through CRI4 according to the column repair of FIG. 8. For example, the first and fourth latches 223a and 223d may respectively store first and fourth column repair information CRI1 and CRI4 having a disable value (e.g., a logic low value), and the second and third latches 223b and 223c may respectively store second and third column repair information CRI2 and CRI3 having an enable value (e.g., a logic high value).

Referring to FIG. 12, a core operation refers to an operation performed by the page buffer circuit 221a in FIG. 4 to determine a program pass or fail in a program operation. First data transfer may be performed by the page buffer circuit 221a in operation S211. For example, data may be transferred from the page buffers of the first and third repair groups RG1 and RG3 to the page buffer decoder 222a through the first and second wired OR lines WOR1 and WOR2. In this case, the page buffers of the second and fourth repair groups RG2 and RG4 may be controlled not to output data through the first and second wired OR lines WOR1 and WOR2. For example, the pass/fail transistor TR_P (see FIG. 6) of each of the page buffers of the first and third repair groups RG1 and RG3 may be turned on to conduct current, and the pass/fail transistor TR_P of each of the page buffers of the second and fourth repair groups RG2 and RG4 may be turned off to stop flow of current.

During the first data transfer, the first and third repair group selection signals RGS1 and RGS3 in an enabled state and the second and fourth repair group selection signals RGS2 and RGS4 in a disabled state may be provided to the page buffer decoder 222a. In this case, even though the first repair group selection signal RGS1 in the enabled state is received, the data received through the first wired OR line WOR1 may not be output to the first wired OR output terminal WOR_out1 because of the first column repair information CRI1 having a disable value and the second repair group selection signal RGS2 in the disabled state. Contrarily, because of the third repair group selection signal RGS3 in the enabled state and the third column repair information CRI3 having an enable value, the data received through the second wired OR line WOR2 may be output to the second wired OR output terminal WOR_out2. For example, the data received from the third repair group RG3 according to the column repair of FIG. 8 may be output from the page buffer decoder 222a.

Second data transfer may be performed by the page buffer circuit 221a in operation S212. For example, data may be transferred from the page buffers of the second and fourth repair groups RG2 and RG4 to the page buffer decoder 222a through the first and second wired OR lines WOR1 and WOR2. In this case, the page buffers of the first and third repair groups RG1 and RG3 may be controlled not to output data through the first and second wired OR lines WOR1 and WOR2. For example, the pass/fail transistor TR_P of each of the page buffers of the first and third repair groups RG1 and RG3 may be turned off to stop current flow, and the pass/fail transistor TR_P of each of the page buffers of the second and fourth repair groups RG2 and RG4 may be turned on to allow current flow.

During the second data transfer, the first and third repair group selection signals RGS1 and RGS3 in the disabled state and the second and fourth repair group selection signals RGS2 and RGS4 in the enabled state may be provided to the page buffer decoder 222a. In this case, because of the second repair group selection signal RGS2 in the enabled state and the second column repair information CRI2 having the enable value, the data received through the first wired OR line WOR1 may be output to the first wired OR output terminal WOR_out1. Contrarily, even though the fourth repair group selection signal RGS4 in the enabled state is received, the data received through the second wired OR line WOR2 may not be output to the second wired OR output terminal WOR_out2 because of the fourth column repair information CRI4 having the disable value and the third repair group selection signal RGS3 in the disabled state. For example, the data received from the second repair group RG2 according to the column repair of FIG. 8 may be output from the page buffer decoder 222a.

As described above, the page buffer decoder 222a may output data from the page buffer circuit 221a based on column repair information corresponding to each repair group. Accordingly, when normal memory cells are replaced with redundant memory cells according to column repair, the page buffer decoder 222a may transfer data to the MBC 270 based on column repair information, wherein the data is used to determine a program pass or fail.

Figure 13:
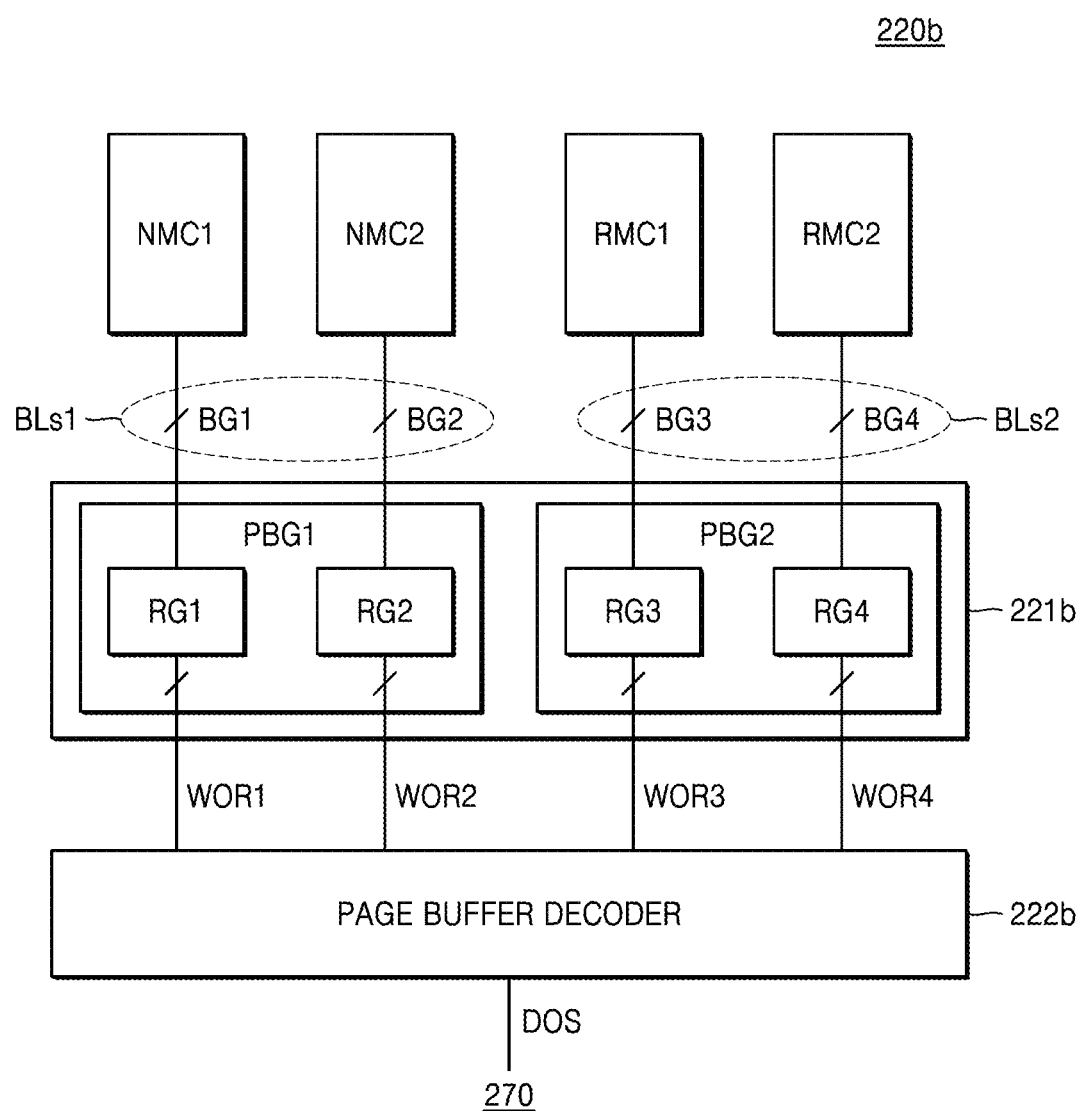
FIG. 13 is a block diagram showing some example embodiments of the page buffer unit in FIG. 2.

FIG. 13 is a block diagram showing some example embodiments of the page buffer unit 220 in FIG. 2. Referring to FIG. 13, a page buffer unit 220b may include a page buffer circuit 221*b* and a page buffer decoder 222*b*. The page buffer circuit 221*b* and the page buffer decoder 222*b* respectively correspond to the page buffer circuit 221*a* and the page buffer decoder 222*a* in FIG. 4, and thus, redundant descriptions thereof are omitted below.

The first through fourth repair groups RG1 through RG4 of the page buffer circuit 221*b* may be connected to the page buffer decoder 222*b* through first through fourth wired OR lines WOR1 through WOR4, respectively. The page buffer decoder 222*b* may receive data from the first through fourth repair groups RG1 through RG4 through the first through fourth wired OR lines WOR1 through WOR4. For example, the data received through the first through fourth wired OR lines WOR1 through WOR4 may include data, which is read from memory cells based on a program verify voltage to determine a program pass or fail during a program operation.

The page buffer decoder 222*b* may provide data, which is received through the first through fourth wired OR lines WOR1 through WOR4, to the MBC 270 as the decoder output signal DOS based on column repair information. For example, when the first normal memory cells NMC1 are replaced with the first redundant memory cells RMC1 according to column repair, data received from the first repair group RG1 through the first wired OR line WOR1 may not be output, and data received from the third repair group RG3 through the third wired OR line WOR3 may be output.

Figure 14:
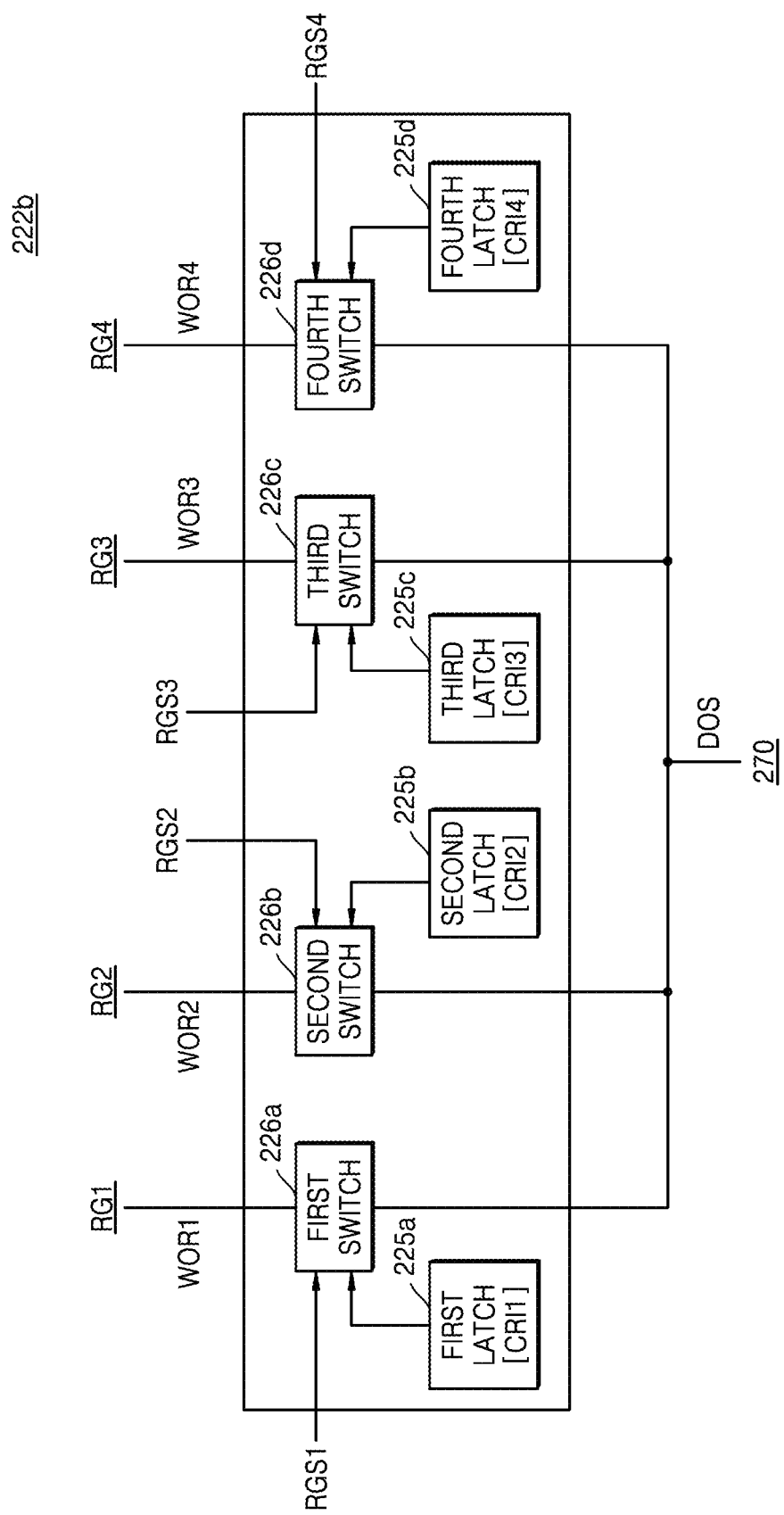
FIG. 14 is an example block diagram of a pager buffer decoder in FIG. 13.

FIG. 14 is an example block diagram of the pager buffer decoder 222*b* in FIG. 13. Referring to FIG. 14, the page buffer decoder 222*b* may include first through fourth latches 225*a* through 225*d* and first through fourth switches 226*a* and 226*d*. The first through fourth latches 225*a* through 225*d* may respectively correspond to the first through fourth latches 223*a* through 223*d* in FIG. 10. As described above with reference to FIG. 10, the first through fourth latches 225*a* through 225*d* may respectively store the first through fourth column repair information CRI1 through CRI4.

The first switch 226*a* may receive data from the first repair group RG1 through the first wired OR line WOR1. For example, the first switch 226*a* may sequentially receive data from the page buffers of the first repair group RG1. For example, the received data may include data, which has been read from normal memory cells connected to the first repair group RG1 to determine a program pass or fail in a program operation.

The first switch 226*a* may output the received data based on the first repair group selection signal RGS1 and the first column repair information CRI1. For example, the first switch 226*a* may output data, which is received through the first wired OR line WOR1, when the first repair group selection signal RGS1 is in an enabled state (e.g., a logic high level) and the first column repair information CRI1 includes an enable value (e.g., a high value).

The second through fourth switches 226*b* through 226*d* may respectively receive data from the second through fourth repair groups RG2 through RG4 through the second through fourth wired OR lines WOR2 through WOR4. As described above with reference to the first switch 226*a*, each of the second through fourth switches 226*b* through 226*d* may output received data based on a corresponding repair group selection signal and corresponding column repair information.

Data output through the first through fourth switches 226*a* through 226*d* may be provided to the MBC 270 as the decoder output signal DOS. Accordingly, the MBC 270 may calculate a fail bit count based on the decoder output signal DOS.

Figure 15:
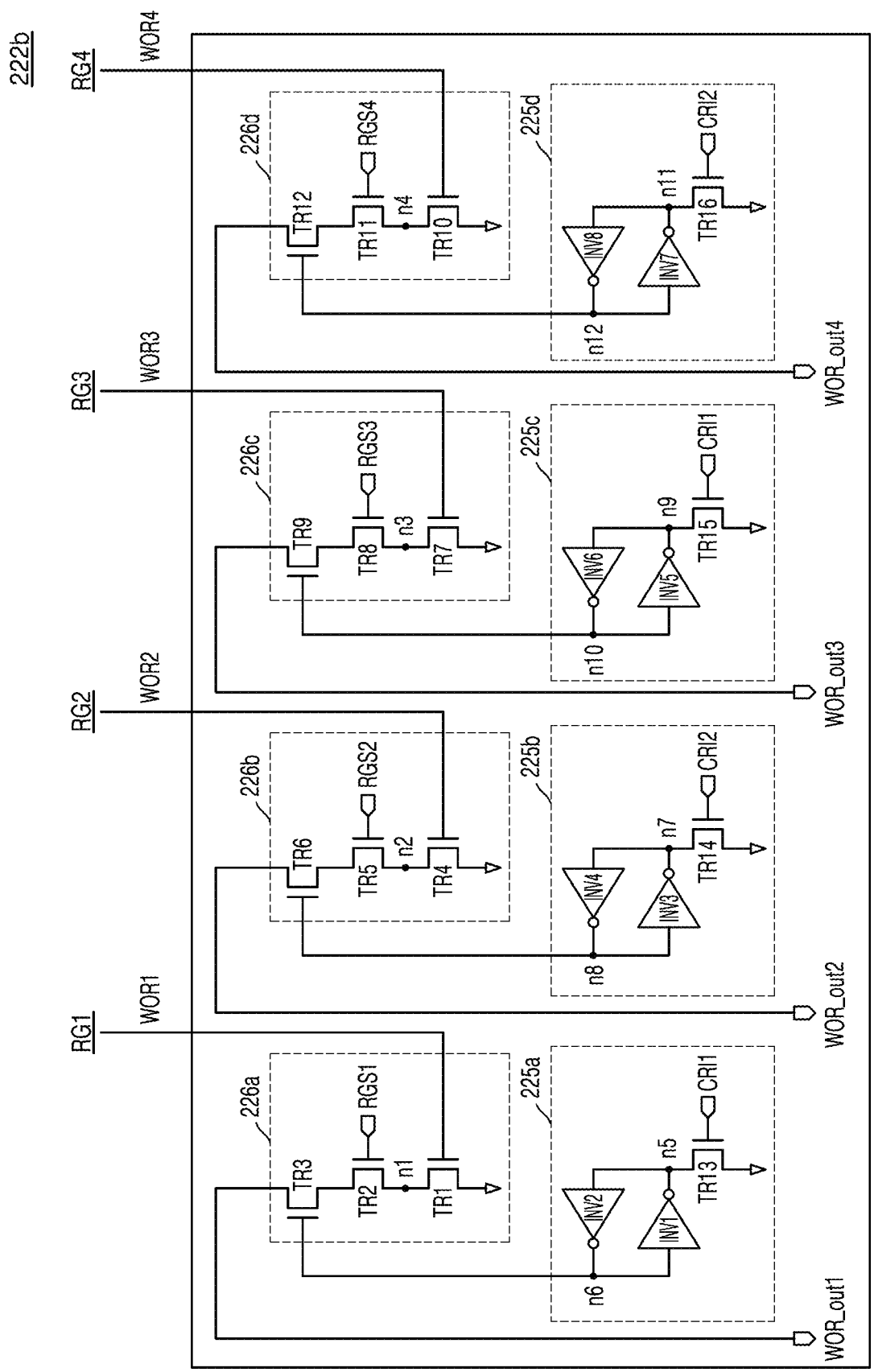
FIG. 15 is an example circuit diagram of the page buffer decoder of FIG. 14.

FIG. 15 is an example circuit diagram of the page buffer decoder 222*b* of FIG. 14. Referring to FIG. 15, the first switch 226*a* may include first through third transistors TR1 through TR3, and the second switch 226*b* may include fourth through sixth transistors TR4 through TR6. The third switch 226*c* may include seventh through ninth transistors TR7 through TR9, and the fourth switch 226*d* may include tenth through twelfth transistors TR10 through TR12. The first latch 225*a* may include a thirteenth transistor TR13 and first and second inverters INV1 and INV2, and the second latch 225*b* may include a fourteenth transistor TR14 and third and fourth inverters INV3 and INV4. The third latch 225*c* may include a 15th transistor TR15 and fifth and sixth inverters INV5 and INV6, and the fourth latch 225*d* may include a 16th transistor TR16 and seventh and eighth inverters INV7 and INV8. As shown in FIG. 15, the configuration of the first latch 225*a* may be substantially the same as that of each of the second through fourth latches 225*b* through 225*d*, and the configuration of the first switch 226*a* may be substantially the same as that of each of the second through fourth switches 226*b* through 226*d*. Hereinafter, for convenience of description, the circuits of the page buffer decoder 222*b* will be described on the basis of the first latch 225*a* and the first switch 226*a*. Although the transistors TR1 to TR16 illustrated in FIG. 15 are NMOS transistors, example embodiments are not limited thereto, and at least one of the transistors TR1 to TR16 illustrated in FIG. 15 may be PMOS transistors.

The first column repair information CRI1 may be input to the gate terminal of the thirteenth transistor TR13 of the first latch 225*a*. The first column repair information CRI1 may be stored by the first and second inverters INV1 and INV2. The first column repair information CRI1 may be provided to the first switch 226*a*. For example, when the first column repair information CRI1 includes an enable value (e.g., a high value), the thirteenth transistor TR13 may be turned on and a fifth node n5 in a precharge state may be changed to a low level. In this case, a sixth node n6 comes to be at a high level/logic high level, and accordingly, the first column repair information CRI1 including the enable value may be provided to the first switch 226*a*. For example, the first column repair information CRI1 includes a disable value (e.g., a low value), the thirteenth transistor TR13 may be turned off, and the fifth node n5 in a precharge state may be maintained at a high level. In this case, because the sixth node n6 is maintained at a low level, the first column repair information CRI1 including the disable value may be provided to the first switch 226*a*.

A first node n1 of the first switch 226*a* may be maintained in a precharge state (i.e., at a high level) or changed to a low level according to data, which is received from one of page buffers of the first repair group RG1 through the first wired OR line WOR1. For example, when data having a low value is received, the first transistor TR1 may be turned off, and accordingly, the first node n1 may be maintained at the precharge state. For example, when data having a high value is received, the first transistor TR1 may be turned on, and accordingly, the first node n1 may be changed to the low level. For example, the voltage level of the first node n1 may vary with data received through the first wired OR line WOR1. The first repair group selection signal RGS1 may be input to the gate terminal of the second transistor TR2. When the second and third transistors TR2 and TR3 are turned on, the data received through the first wired OR line WOR1 may be output to the first wired OR output terminal WOR_out1.

First through fourth wired OR output terminals WOR_out1 through WOR_out4 may be connected to one another through a data line, through which the decoder output signal DOS is transmitted, as shown in FIG. 14. Accordingly, data output through the first through fourth wired OR output terminals WOR_out1 through WOR_out4 may be provided to the MBC 270 as the decoder output signal DOS.

As described above, according to some example embodiments, the page buffer unit 220b may include a wired OR line and a switch, which correspond to each repair group. In this case, the configuration of the switch of the page buffer unit 220b may be simpler than that of a switch of the page buffer unit 220a described above with reference to FIGS. 10 and 11.

Figure 16:
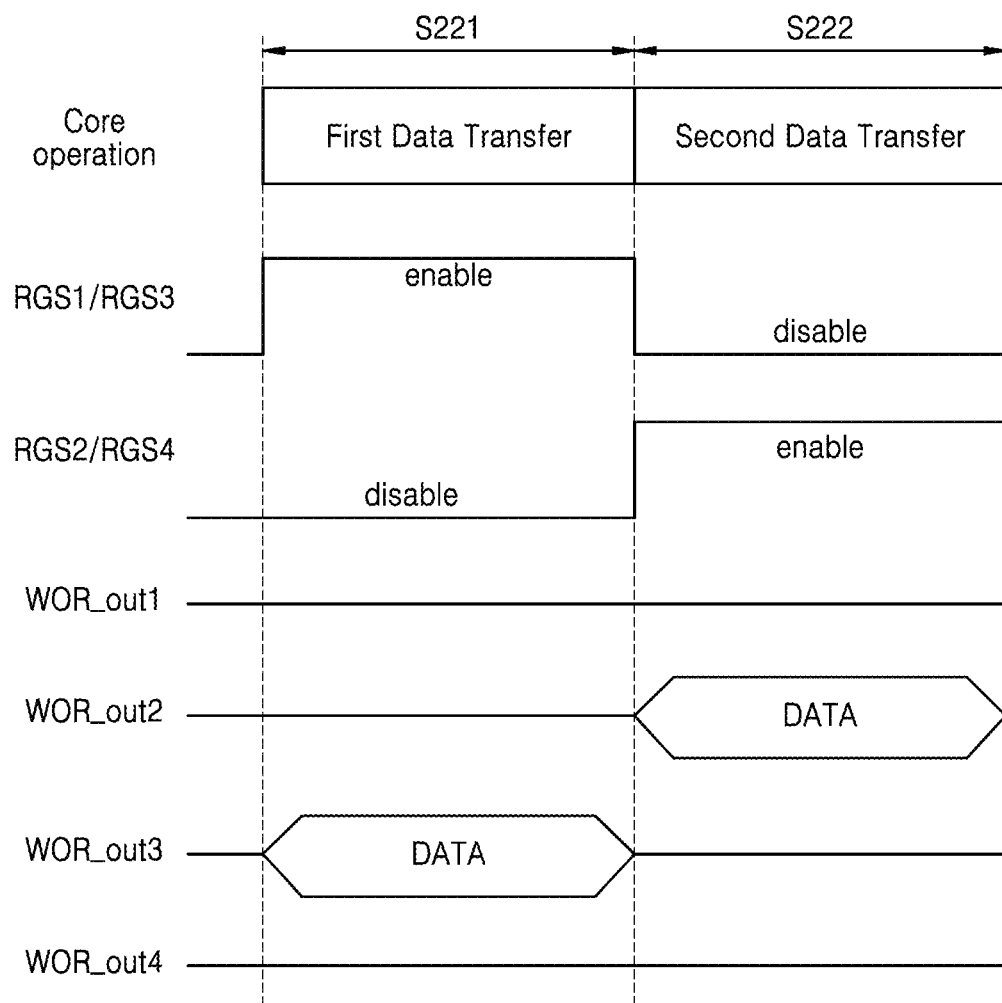
FIG. 16 is a timing diagram for describing an operation of the page buffer decoder of FIG. 15.

FIG. 16 is a timing diagram for describing an operation of the page buffer decoder 222b of FIG. 15. In detail, FIG. 16 shows an example, in which data is output from the page buffer decoder 222b according to column repair, by which the first normal memory cells NMC1 are replaced with the first redundant memory cells RMC1 as described above with reference to FIG. 8.

Referring to FIG. 16, a core operation refers to an operation performed by the page buffer circuit 221b in FIG. 13 to determine a program pass or fail in a program operation. First data transfer may be performed by the page buffer circuit 221b in operation S221. For example, data may be transferred from the page buffers of the first and third repair groups RG1 and RG3 to the page buffer decoder 222b through the first and third wired OR lines WOR1 and WOR3. In this case, the page buffers of the second and fourth repair groups RG2 and RG4 may be controlled not to output data through the second and fourth wired OR lines WOR2 and WOR4.

During the first data transfer, the first and third repair group selection signals RGS1 and RGS3 in an enabled state and the second and fourth repair group selection signals RGS2 and RGS4 in a disabled state may be provided to the page buffer decoder 222b. In this case, because of the third repair group selection signal RGS3 in the enabled state and the third column repair information CRI3 having an enable value, the data received through the third wired OR line WOR3 may be output to the third wired OR output terminal WOR_out3. For example, the data received from the third repair group RG3 according to the column repair of FIG. 8 may be output from the page buffer decoder 222b.

Second data transfer may be performed by the page buffer circuit 221b in operation S222. For example, data may be transferred from the page buffers of the second and fourth repair groups RG2 and RG4 to the page buffer decoder 222b through the second and fourth wired OR lines WOR2 and WOR4. In this case, the page buffers of the first and third repair groups RG1 and RG3 may be controlled not to output data through the first and third wired OR lines WOR1 and WOR3.

During the second data transfer, the first and third repair group selection signals RGS1 and RGS3 in the disabled state and the second and fourth repair group selection signals RGS2 and RGS4 in the enabled state may be provided to the page buffer decoder 222b. In this case, because of the second repair group selection signal RGS2 in the enabled state and the second column repair information CRI2 having the enable value, the data received through the second wired OR line WOR2 may be output to the second wired OR output terminal WOR_out2. For example, the data received from the second repair group RG2 according to the column repair of FIG. 8 may be output from the page buffer decoder 222b.

Figure 17:
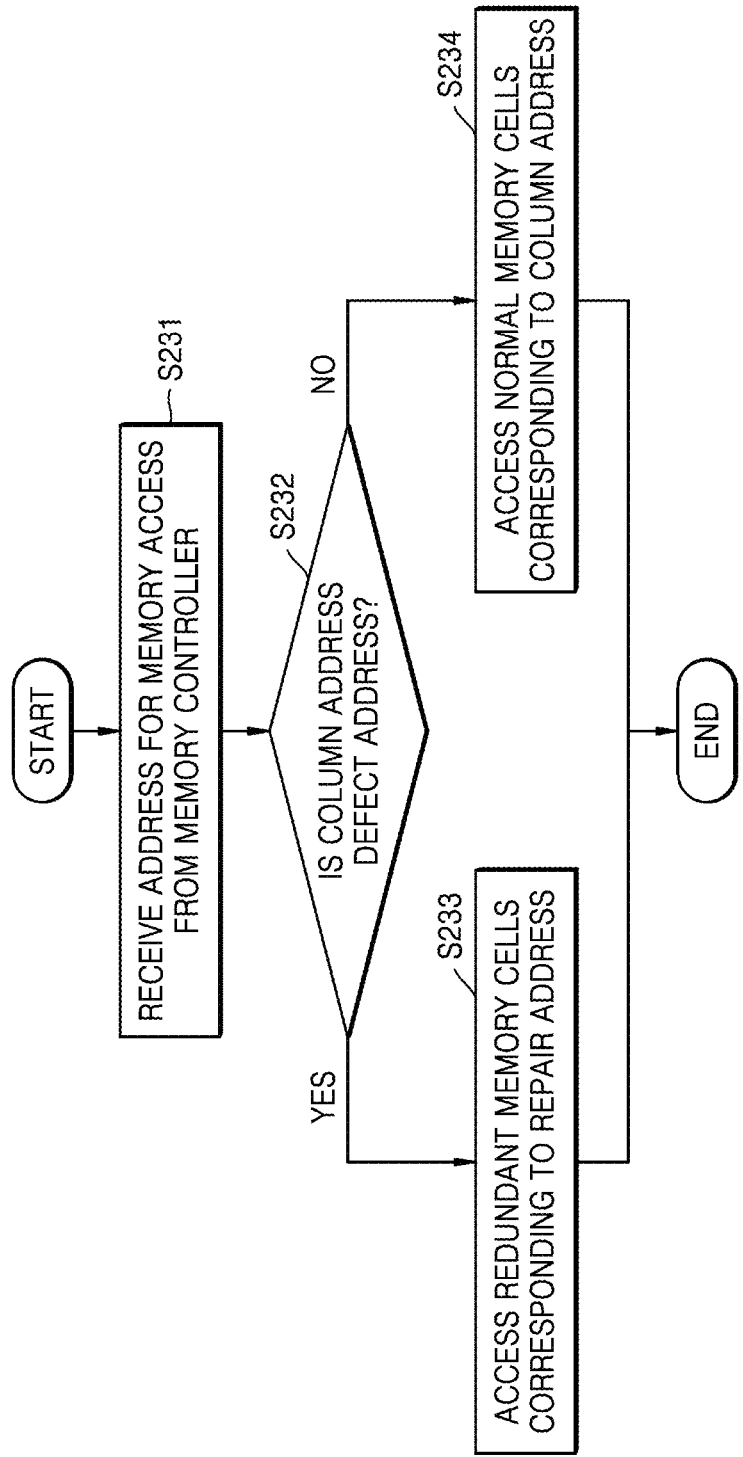
FIG. 17 is a flowchart of an example of an operation of the memory device of FIG. 2.

FIG. 17 is a flowchart of an example of an operation of the memory device 200 of FIG. 2. Referring to FIGS. 2 and 17, the memory device 200 may receive the address ADDR for memory access from the memory controller 100 in operation S231. For example, the memory device 200 may receive the address ADDR for a program operation or a read operation.

The memory device 200 may determine whether a column address in the address ADDR is a defect address in operation S232. For example, the memory device 200 may determine whether the received column address is a defect address based on column repair mapping information.

When the column address is a defect address, the memory device 200 may access redundant memory cells corresponding to a repair address in operation S233. For example, the memory device 200 may identify the repair address corresponding to the defect address based on the column repair mapping information. The memory device 200 may program data to and/or read data from the redundant memory cells corresponding to the repair address.

For example, in a program operation, the control logic circuit 240 may control the page buffer unit 220 and the data I/O circuit 230 such that the data DATA to be programmed is stored in the redundant memory cells corresponding to the repair address. In the program operation, the control logic circuit 240 may control the page buffer unit 220 to determine a program pass or fail so that the decoder output signal DOS may be output from the page buffer decoder 222, as described above with reference to FIGS. 2 through 16. Accordingly, a fail bit count may be calculated by the MBC 270, and a program pass or fail may be determined based on the fail bit count.

For example, in a read operation, the control logic circuit 240 may control the page buffer unit 220 and the data I/O circuit 230 such that data is read from the redundant memory cells corresponding to the repair address. In this case, the data read from the redundant memory cells may be transmitted to the memory controller in FIG. 1 through the page buffer circuit 221, the page buffer decoder 222, and the data I/O circuit 230.

When the column address is not a defect address, the memory device 200 may access normal memory cells corresponding to the column address in operation S234. For example, the memory device 200 may program data to and/or read data from the normal memory cells corresponding to the column address.

Figure 18:
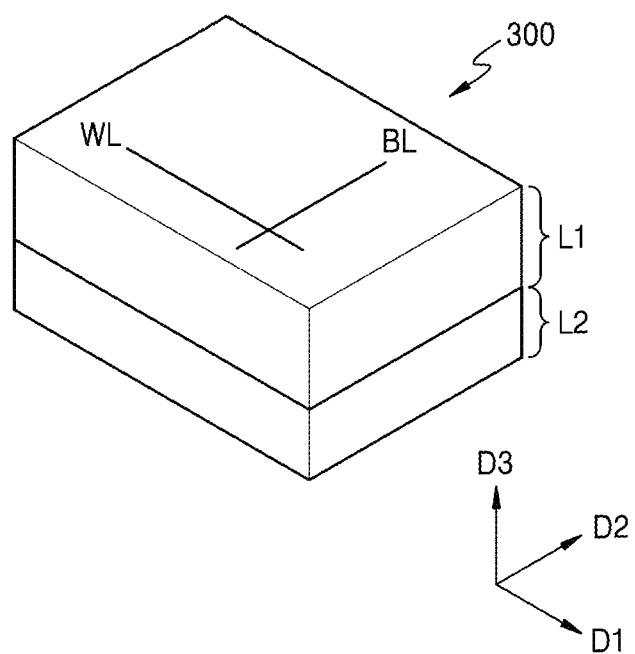
FIG. 18 is a schematic diagram of the structure of the memory device in FIG. 1.

FIG. 18 is a schematic diagram of the structure of the memory device 200 in FIG. 1. Referring to FIG. 18, a memory device 300 may include a first semiconductor layer L1 and a second semiconductor layer L2. The first semiconductor layer L1 may be stacked on the second semiconductor layer L2 in the third direction D3 (e.g., the vertical direction). In detail, the second semiconductor layer L2 may be below the first semiconductor layer L1 in the third direction D3.

In some example embodiments, the memory cell array 210 in FIG. 2 may be formed in the first semiconductor layer L1, and the peripheral circuits PECT in FIG. 2 may be formed in the second semiconductor layer L2. Accordingly, the memory device 300 may have a cell over periphery (COP) structure, in which the memory cell array 210 is above the peripheral circuits PECT. The COP structure may effectively reduce an area in a horizontal direction (e.g., in the first and second directions D1 and D2) and may increase the integration density of the memory device 300.

In some example embodiments, the second semiconductor layer L2 may include a substrate. The peripheral circuits PECT may be formed in the second semiconductor layer L2 by forming transistors (e.g., the transistors in FIGS. 6, 11, and 15) and metal patterns (e.g., lower conductive lines PM1, PM2, and PM3 in FIG. 19) for the wiring of the transistors on the substrate. The transistors may be planar transistors; however, example embodiments are not limited thereto. After the peripheral circuits PECT are formed in the second semiconductor layer L2, the first semiconductor layer L1 including the memory cell array 210 may be formed. Metal patterns, which electrically connect word lines WL and bit lines BL of the memory cell array 210 to the peripheral circuits PECT in the second semiconductor layer L2, may be formed. For example, the word lines WL may extend in the first direction D1, and the bit lines BL may extend in the second direction D2.

The memory device 300 may have the COP structure as described above, but example embodiments are not limited thereto. For example, the memory device 300 may have a chip-to-chip (C2C) structure. In this case, the first semiconductor layer L1 may correspond to an upper chip, and the second semiconductor layer L2 may correspond to a lower chip. In the C2C structure, the first semiconductor layer L1 may include the memory cell array 210 in FIG. 2 on a first substrate/wafer, and the second semiconductor layer L2 may include the peripheral circuits PECT in FIG. 2 on a second substrate/wafer. The first semiconductor layer L1 may be connected to the second semiconductor layer L2 using a bonding method. For example, a bonding metal (e.g., an upper bonding metal 372c in FIG. 21) formed in a top metal layer of the first semiconductor layer L1 may be electrically connected to a bonding metal (e.g., a lower bonding metal 472c in FIG. 21) formed in a top metal layer of the second semiconductor layer L2. For example, when a bonding metal includes copper (Cu), the bonding method may include a Cu—Cu bonding method. The bonding metal may include aluminum and/or tungsten. For example, the first semiconductor layer L1 and the second semiconductor layer L2 may be stacked at a wafer level. For example, the first semiconductor layer L1 and the second semiconductor layer L2 may be stacked at a chip level. For example, the first semiconductor layer L1 and the second semiconductor layer L2 may be stacked with a chip to wafer bonding.

Figure 19:
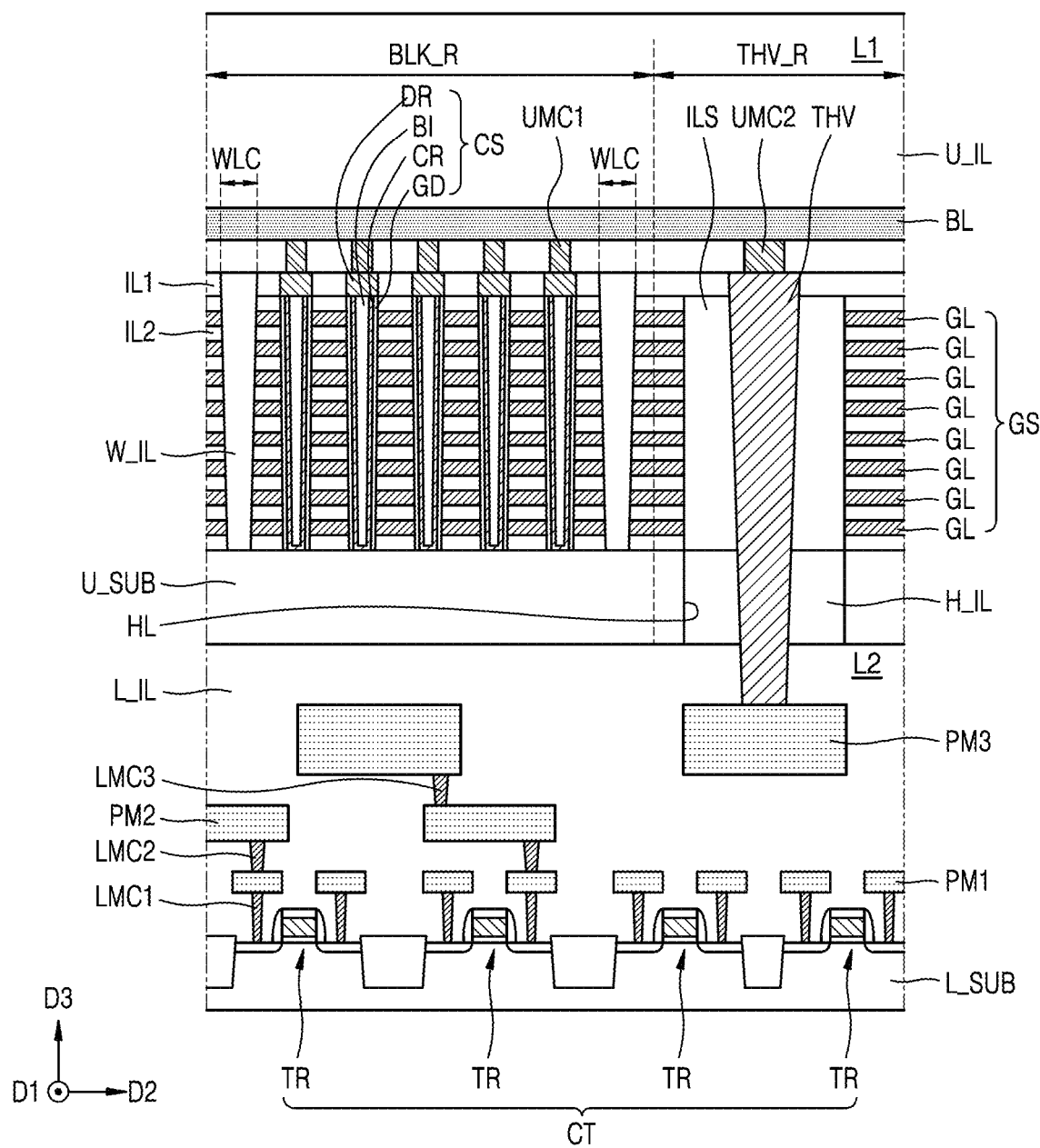
FIG. 19 is an example cross-sectional view of the memory device of FIG. 18.

FIG. 19 is an example cross-sectional view of the memory device 300 of FIG. 18. In detail, FIG. 19 shows a cross-sectional view of a memory device 300a having a COP structure. Referring to FIG. 19, the second semiconductor layer L2 may include a lower substrate L_SUB and circuits CT formed in the lower substrate L_SUB. The circuits CT may include at least one transistor TR. The circuits CT may include the page buffer circuit 221 and the page buffer decoder 222, which have been described with reference to FIGS. 1 through 17. For example, as described above with reference to FIG. 7, transistors TR forming a page buffer of the page buffer circuit 221 may be arranged in a line in the second direction D2.

The second semiconductor layer L2 may further include lower contacts LMC1, LMC2, and LMC3, which are electrically connected to the circuits CT, and lower conductive lines PM1, PM2, and PM3, which are electrically connected to the lower contacts LMC1, LMC2, and LMC3. The circuits CT, the lower contacts LMC1, LMC2, and LMC3, and the lower conductive lines PM1, PM2, and PM3 may be covered with a lower insulating layer L_IL.

The first semiconductor layer L1 may include an upper substrate U_SUB and a plurality of channel structures CS on the upper substrate U_SUB. The channel structures CS may extend through gate conductive layers GS in the vertical direction (e.g., the third direction D3). The channel structures CS may be separated from one another at a certain distance in the first and second directions D1 and D2. Each of the channel structures CS may include a gate dielectric film GD, a channel region CR, a buried insulating film BI, and a drain region DR. The gate dielectric film GD may include a tunneling dielectric film, a charge storage film, and a blocking dielectric film, which are sequentially formed on the channel region CR. The channel region CR may include doped polysilicon or undoped polysilicon. The channel region CR may have a cylindrical shape and/or a pillar shape. The inner space of the channel region CR may be filled with the buried insulating film BI. The buried insulating film BI may include an insulating material. In some example embodiments, the buried insulating film BI may be omitted. In this case, the channel region CR may have a pillar shape without an inner space. The drain region DR may include a doped polysilicon film. The drain region DR may be electrically connected to a bit line BL through a first upper contact UMC1. A plurality of drain regions DR of the channel structures CS may be insulated from each other by a first insulating film IL1.

The first semiconductor layer L1 may further include first upper contacts UMC1 electrically connected to the channel structures CS, a second upper contact UMC2 electrically connected to a through electrode, that is, a through hole via THV, and the bit line BL. The channel structures CS and the bit line BL may be covered with an upper insulating layer U_IL.

The through electrode THV may extend through the gate conductive layers GS in the vertical direction (i.e., the third direction D3). The through electrode THV may pass through the upper substrate U_SUB through a through hole HL. The through electrode THV may extend to a portion of the second semiconductor layer L2 in the vertical direction (i.e., the third direction D3). The through electrode THV may be surrounded by the first insulating film IL1 and an insulating structure ILS and surrounded by a buried insulating film H_IL in the through hole HL. The through electrode THV may include an end connected to the bit line BL through the second upper contact UMC2 and an opposite end connected to the lower conductive line PM3. Accordingly, the bit line BL of the first semiconductor layer L1 may be electrically connected to the circuits CT of the second semiconductor layer L2 through the through electrode THV.

The channel structures CS may be in a block region BLK_R, and the through electrode THV may be in a through electrode region, that is, a through hole via region THV_R. The block region BLK_R may be separated from the through electrode region THV_R by a plurality of word line cut regions WLC, which extend on the upper substrate U_SUB in the first and second directions D1 and D2. The word line cut regions WLC may be filled with an insulating film W_IL.

The gate conductive layers GS may include a plurality of gate lines GL extending in the second direction D2 to be parallel with each other. For example, the gate lines GL may form a ground selection line, word lines, and a string selection line. For example, the ground selection line, the word lines, and the string selection line may be sequentially formed on the upper substrate U_SUB, as described above with reference to FIG. 3. A second insulating film IL2 may be formed between gate lines GL. For example, the ground selection line and a portion of a channel structure CS adjacent to the ground selection line may form the ground selection transistor GST in FIG. 3. The word lines and a portion of the channel structure CS adjacent to the words lines may form the memory cells MCs in FIG. 3. The string selection line and a portion of the channel structure CS adjacent to the string selection line may form the string selection transistor SST in FIG. 3.

In some example embodiments, the channel structures CS in the block region BLK_R may form the memory cell array 210 described above with reference to FIGS. 1 through 17. In detail, the channel structures CS may form normal memory cells and redundant memory cells. In addition, the circuits CT in the second semiconductor layer L2 may form the page buffer circuit 221 and the page buffer decoder 222, which are described with reference to FIGS. 1 through 17. Accordingly, column repair may be performed according to embodiments.

Figure 20:
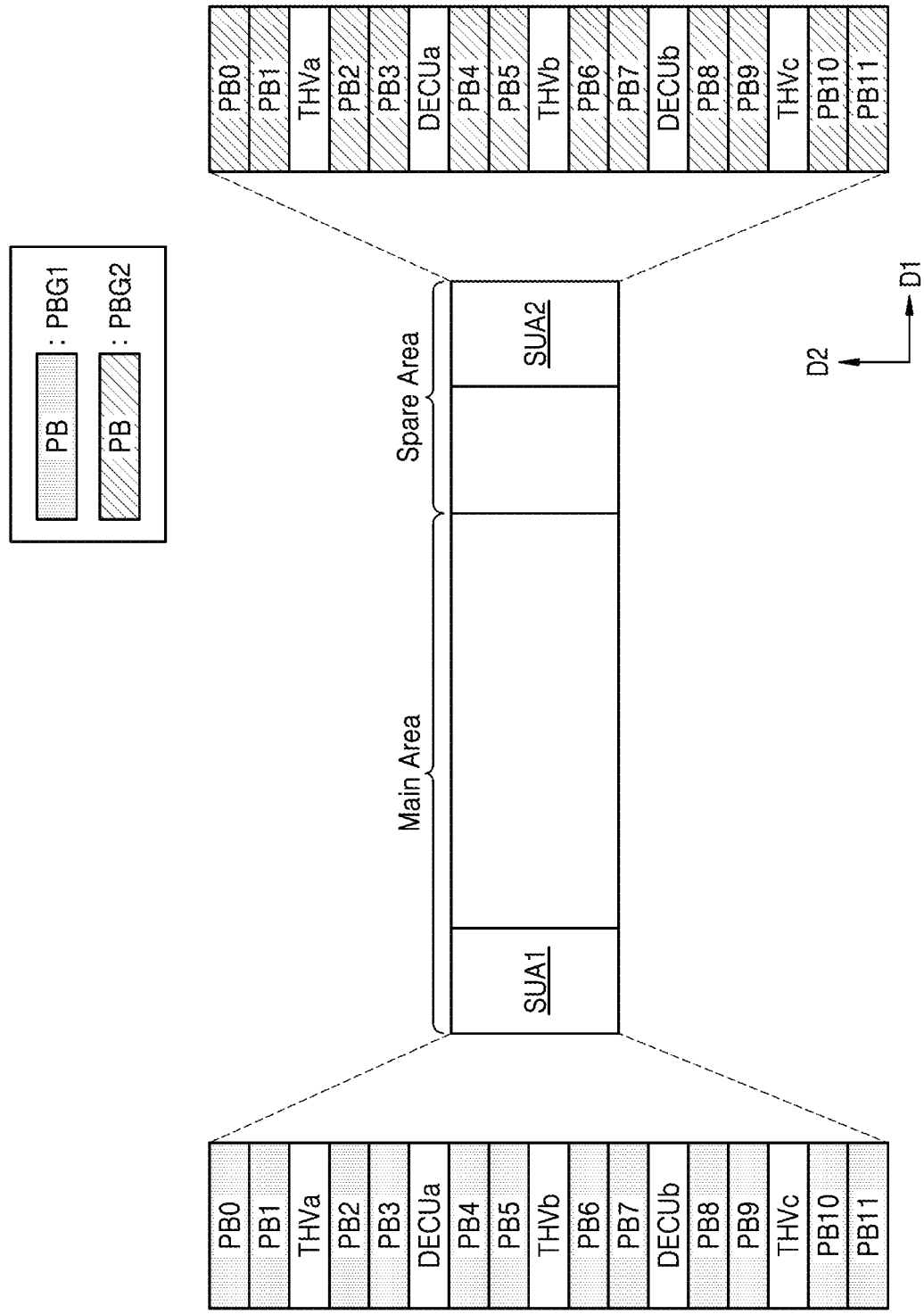
FIG. 20 is a diagram of an example of the page buffer groups in FIG. 4 according to the memory device of FIG. 19.

FIG. 20 is a diagram of an example of the page buffer groups PBG1 and PBG2 in FIG. 4 according to the memory device 300a of FIG. 19. Referring to FIGS. 4, 19, and 20, a memory cell array, which is divided into a main area and a spare area, may be formed in the first semiconductor layer L1. Normal memory cells may be arranged in the main area, and redundant memory cells may be arranged in the spare area. For example, the main area and the spare area may be included in the block region BLK_R of the first semiconductor layer L1.

The first through twelfth page buffers PB0 through PB11, contact regions THVa through THVc, and page buffer decoder units DECUa and DECUb may be arranged in the second semiconductor layer L2 in a line in the second direction D2 in correspondence to each of the first and second sub areas SUA1 and SUA2, which are respectively in the main area and the spare area. The first through twelfth page buffers PB0 through PB11 corresponding to the first sub area SUA1 may be included in the first page buffer group PBG1, and the first through twelfth page buffers PB0 through PB11 corresponding to the second sub area SUA2 may be included in the second page buffer group PBG2. One of the page buffer decoder units DECUa and DECUb corresponding to the first sub area SUA1 may correspond to the first page buffer decoder unit DECU1 in FIG. 5. One of the page buffer decoder units DECUa and DECUb corresponding to the second sub area SUA2 may correspond to the second page buffer decoder unit DECU2 in FIG. 5.

Each of the page buffer decoder units DECUa and DECUb may be between two adjacent ones of the first through twelfth page buffers PB0 through PB11. For example, the page buffer decoder unit DECUa may be between the fourth page buffer PB3 and the fifth page buffer PB4, and the page buffer decoder unit DECUb may be between the eighth page buffer PB7 and the ninth page buffer PB8. In this case, the first through twelfth page buffers PB0 through PB11 may be connected to the page buffer decoder unit DECUa or DECUb through a wired OR line, as described above with reference to FIG. 4. For example, when the page buffer decoder unit DECUa is connected to the first page buffer group PBG1, the page buffer decoder unit DECUb may be connected to another page buffer group.

Each of the contact regions THVa through THVc may be between two adjacent ones of the first through twelfth page buffers PB0 through PB11. For example, the contact region THVa may be between the second page buffer PB1 and the third page buffer PB2, the contact region THVb may be between the sixth page buffer PB5 and the seventh page buffer PB6, and the contact region THVc may be between the tenth page buffer PB9 and the eleventh page buffer PB10.

At least one through electrode THV may be arranged in each of the contact regions THVa through THVc. Each of the first through twelfth page buffers PB0 through PB11 may be connected to a corresponding bit line BL through the through electrode THV in a corresponding contact region.

For example, each of the first through fourth page buffers PB0 through PB3 may be connected to the bit line BL through the through electrode THV of the contact region THVa. Each of the fifth through eighth page buffers PB4 through PB7 may be connected to the bit line BL through the through electrode THV of the contact region THVb. Each of the ninth through twelfth page buffers PB8 through PB11 may be connected to the bit line BL through the through electrode THV of the contact region THVc.

In a COP structure, each of the first through twelfth page buffers PB0 through PB11 may include the high-voltage unit HVU, the main unit MU, and the cache unit CU, as shown in FIG. 6. In this case, the high-voltage unit HVU may be adjacent to a corresponding contact region, and the main unit MU and the cache unit CU may be in one region, different from that described with reference to FIG. 7.

Figure 21:
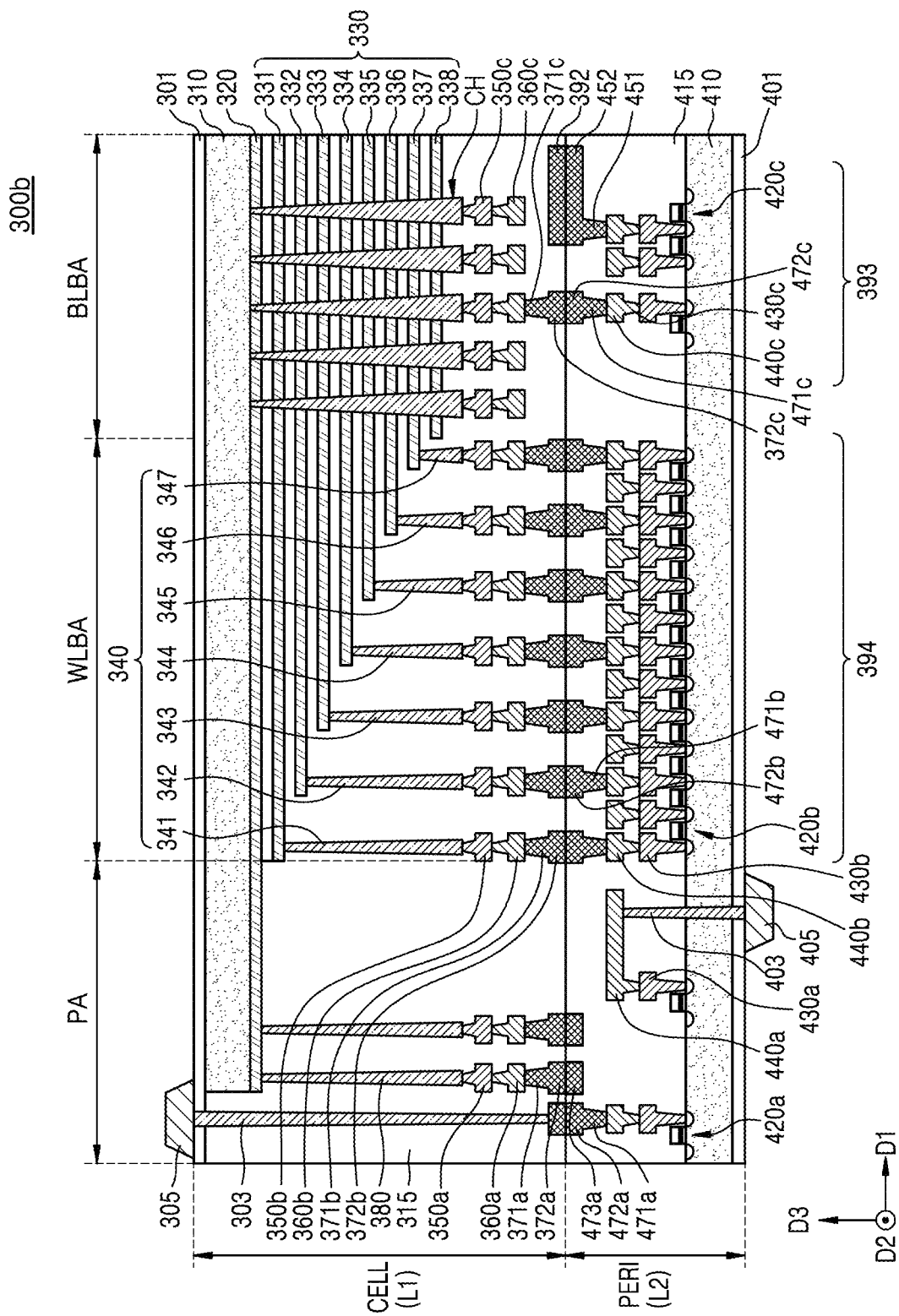
FIG. 21 is an example cross-sectional view of the memory device of FIG. 18.

FIG. 21 is an example cross-sectional view of the memory device 300 of FIG. 18. In detail, FIG. 21 is a cross-sectional view of a memory device 300b having a C2C structure. Referring to FIG. 21, a cell area CELL of the memory device 300b may correspond to the first semiconductor layer L1, and a peripheral circuit area PERI of the memory device 300b may correspond to the second semiconductor layer L2. Each of the peripheral circuit area PERI and the cell area CELL of the memory device 300b may include an external pad bonding area PA, a word line bonding area WLBA, and a bit line bonding area BLBA.

The peripheral circuit area PERI may include a first substrate 410, an interlayer insulating layer 415, a plurality of circuit devices 420a, 420b, and 420c formed in the first substrate 410, first metal layers 430a, 430b, and 430c respectively connected to the circuit devices 420a, 420b, and 420c, and second metal layers 440a, 440b, and 440c respectively formed on the first metal layers 430a, 430b, and 430c. In some example embodiments, the first metal layers 430a, 430b, and 430c may include tungsten having a relatively higher resistance, and the second metal layers 440a, 440b, and 440c may include copper having a relatively lower resistance.

As described herein, only the first metal layers 430a, 430b, and 430c and the second metal layers 440a, 440b, and 440c are illustrated and described, but example embodiments are not limited thereto. At least one metal layer may be further formed on the second metal layers 440a, 440b, and 440c. At least a portion of the at least one metal layer on the second metal layers 440a, 440b, and 440c may include aluminum, which has a lower resistance than copper included in the second metal layers 440a, 440b, and 440c.

The interlayer insulating layer 415 may be arranged on the first substrate 410 to cover the circuit devices 420a, 420b, and 420c, the first metal layers 430a, 430b, and 430c, and the second metal layers 440a, 440b, and 440c and may include an insulating material such as silicon oxide or silicon nitride.

Lower bonding metals 471b and 472b may be formed on the second metal layer 440b in the word line bonding area WLBA. In the word line bonding area WLBA, the lower bonding metals 471b and 472b of the peripheral circuit area PERI may be electrically connected to upper bonding metals 371b and 372b of the cell area CELL using a bonding method. The lower bonding metals 471b and 472b and the upper bonding metals 371b and 372b may include aluminum, copper, or tungsten.

The cell area CELL may provide at least one memory block. The cell area CELL may include a second substrate 310 and a common source line 320. A plurality of word lines 331 through 338 (collectively denoted by 330) may be stacked on the second substrate 310 in a direction (i.e., the third direction D3) perpendicular to a top surface of the second substrate 310. String selection lines may be arranged above the word lines 330 and a ground selection line may be arranged below the word lines 330. The word lines 330 may be arranged between the string selection lines and the ground selection line.

In the bit line bonding area BLBA, a channel structure CH may extend in the direction perpendicular to the top surface of the second substrate 310 and pass through the word lines 330, the string selection lines, and the ground selection line. The channel structure CH may include a data storage layer, a channel layer, and a buried insulating layer. The channel layer may be electrically connected to a first metal layer 350*c* and a second metal layer 360*c*. For example, the first metal layer 350*c* may correspond to a bit line contact, and the second metal layer 360*c* may correspond to a bit line and may be referred to as a bit line 360*c* below. In some example embodiments, the bit line 360*c* may extend in the second direction D2 parallel with the top surface of the second substrate 310.

In some example embodiments, an area, in which the channel structure CH and the bit line 360*c* are arranged, may be defined as the bit line bonding area BLBA. The bit line 360*c* may be electrically connected to circuit devices 420*c*, which provide a page buffer 393 of the peripheral circuit area PERI, in the bit line bonding area BLBA. For example, the bit line 360*c* may be connected to upper bonding metals 371*c* and 372*c* in the bit line bonding area BLBA, and the upper bonding metals 371*c* and 372*c* may be connected to lower bonding metals 471*c* and 472*c* connected to the circuit devices 420*c* of the page buffer 393. Accordingly, the page buffer 393 may be connected to the bit line 360*c* through bonding metals, e.g., the upper bonding metals 371*c* and 372*c* and the lower bonding metals 471*c* and 472*c*. In some example embodiments, the page buffer 393 may correspond to a page buffer of the page buffer circuit 221 described with reference to FIGS. 1 through 17. For example, page buffers 393 of a page buffer group may be arranged in a line in the second direction D2, in which the bit line 360*c* extends. Although not shown in FIG. 21, a page buffer decoder described with reference to FIGS. 1 through 17 may be further arranged in the bit line bonding area BLBA.

In the word line bonding area WLBA, the word lines 330 may extend in the first direction D1 parallel with the top surface of the second substrate 310 and may be connected to a plurality of cell contact plugs 341 through 347 (collectively denoted by 340). The word lines 330 may be connected to the cell contact plugs 340 through pads, which are provided by at least some of the word lines 330 extending in different lengths in the first direction D1. A first metal layer 350*b* and a second metal layer 360*b* may be sequentially stacked on each of the cell contact plugs 340 connected to the word lines 330. The cell contact plugs 340 in the word line bonding area WLBA may be connected to the peripheral circuit area PERI through the upper bonding metals 371*b* and 372*b* of the cell area CELL and the lower bonding metals 471*b* and 472*b* of the peripheral circuit area PERI.

The cell contact plugs 340 may be electrically connected to circuit devices 420*b*, which provide a row decoder 394 in the peripheral circuit area PERI. In some example embodiments, operating voltages of the circuit devices 420*b* providing the row decoder 394 may be different from operating voltages of the circuit devices 420*c* providing the page buffer 393. For example, the operating voltages of the circuit devices 420*c* providing the page buffer 393 may be greater than the operating voltages of the circuit devices 420*b* providing the row decoder 394.

A common source line contact plug 380 may be arranged in the external pad bonding area PA. The common source line contact plug 380 may include a conductive material such as metal, a metal compound, or polysilicon and may be electrically connected to the common source line 320. A first metal layer 350*a* and a second metal layer 360*a* may be sequentially stacked on the common source line contact plug 380. For example, an area, in which the common source line contact plug 380, the first metal layer 350*a*, and the second metal layer 360*a* are arranged, may be defined as the external pad bonding area PA.

First and second input/output pads 405 and 305 may be arranged in the external pad bonding area PA. A lower insulating film 401 covering a bottom surface of the first substrate 410 may be formed below the first substrate 410, and the first input/output pad 405 may be formed on the lower insulating film 401. The first input/output pad 405 may be connected to at least one of the circuit devices 420*a*, 420*b*, and 420*c* of the peripheral circuit area PERI through a first input/output contact plug 403 and may be isolated from the first substrate 410 by the lower insulating film 401. A side insulating film may be arranged between the first input/output contact plug 403 and the first substrate 410 to electrically isolate the first input/output contact plug 403 from the first substrate 410.

An upper insulating film 301 covering a top surface of the second substrate 310 may be formed above the second substrate 310, and the second input/output pad 305 may be arranged on the upper insulating film 301. The second input/output pad 305 may be connected to at least one of the circuit devices 420*a*, 420*b*, and 420*c* of the peripheral circuit area PERI through a second input/output contact plug 303

According to some example embodiments, the second substrate 310 and the common source line 320 may not be arranged in an area, in which the second input/output contact plug 303 is arranged. The second input/output pad 305 may not overlap the word lines 330 in the third direction D3. The second input/output contact plug 303 may be separated from the second substrate 310 in the direction parallel with the top surface of the second substrate 310 and may pass through an interlayer insulating layer 315 of the cell area CELL to be connected to the second input/output pad 305.

According to some example embodiments, the first input/output pad 405 and the second input/output pad 305 may be selectively formed. For example, the memory device 300*b* may include only the first input/output pad 405 on the first substrate 410 or only the second input/output pad 305 on the second substrate 310. Alternatively, the memory device 300 may include both the first input/output pad 405 and the second input/output pad 305.

A metal pattern of a topmost metal layer may be provided as a dummy pattern in the external pad bonding area PA of each of the cell area CELL and the peripheral circuit area PERI, or the topmost metal layer may be empty.

In correspondence to an upper metal pattern 372*a* in the topmost metal layer of the cell area CELL, a lower metal pattern 473*a* having the same shape as upper metal pattern 372*a* may be formed in a topmost metal layer of the peripheral circuit area PERI in the external pad bonding area PA. The lower metal pattern 473*a* in the topmost metal layer of the peripheral circuit area PERI may not be connected to a contact in the peripheral circuit area PERI. Similarly, in correspondence to a lower metal pattern in the topmost metal layer of the peripheral circuit area PERI in the external pad bonding area PA, an upper metal pattern having the same shape as lower metal pattern of the peripheral circuit area PERI may be formed in the topmost metal layer of the cell area CELL.

The lower bonding metals 471b and 472b may be formed on the second metal layer 440b in the word line bonding area WLBA. In the word line bonding area WLBA, the lower bonding metals 471b and 472b of the peripheral circuit area PERI may be electrically connected to the upper bonding metals 371b and 372b of the cell area CELL using a bonding method.

In correspondence to a lower metal pattern 452 formed in the topmost metal layer of the peripheral circuit area PERI, in the bit line bonding area BLBA, an upper metal pattern 392 having the same shape as the lower metal pattern 452 may be formed on the topmost metal layer of the cell area CELL. In the bit line bonding area BLBA, the lower bonding metals 451 and 452 of the peripheral circuit area PERI may be electrically connected to the upper metal pattern 392 of the cell area CELL using a bonding method. A contact may not be formed on the upper metal pattern 392 in the topmost metal layer of the cell area CELL.

In some example embodiments, the memory cell array 210 in FIG. 2 may be in the cell area CELL, and the peripheral circuits PECT in FIG. 2 may be in the peripheral circuit area PERI. For example, normal memory cells and redundant memory cells may be in the cell area CELL, and the page buffer circuit 221 and the page buffer decoder 222, which are described with reference to FIGS. 1 through 17, may be in the peripheral circuit area PERI. Accordingly, the memory device 300b may perform column repair according to some example embodiments.

Figure 22:
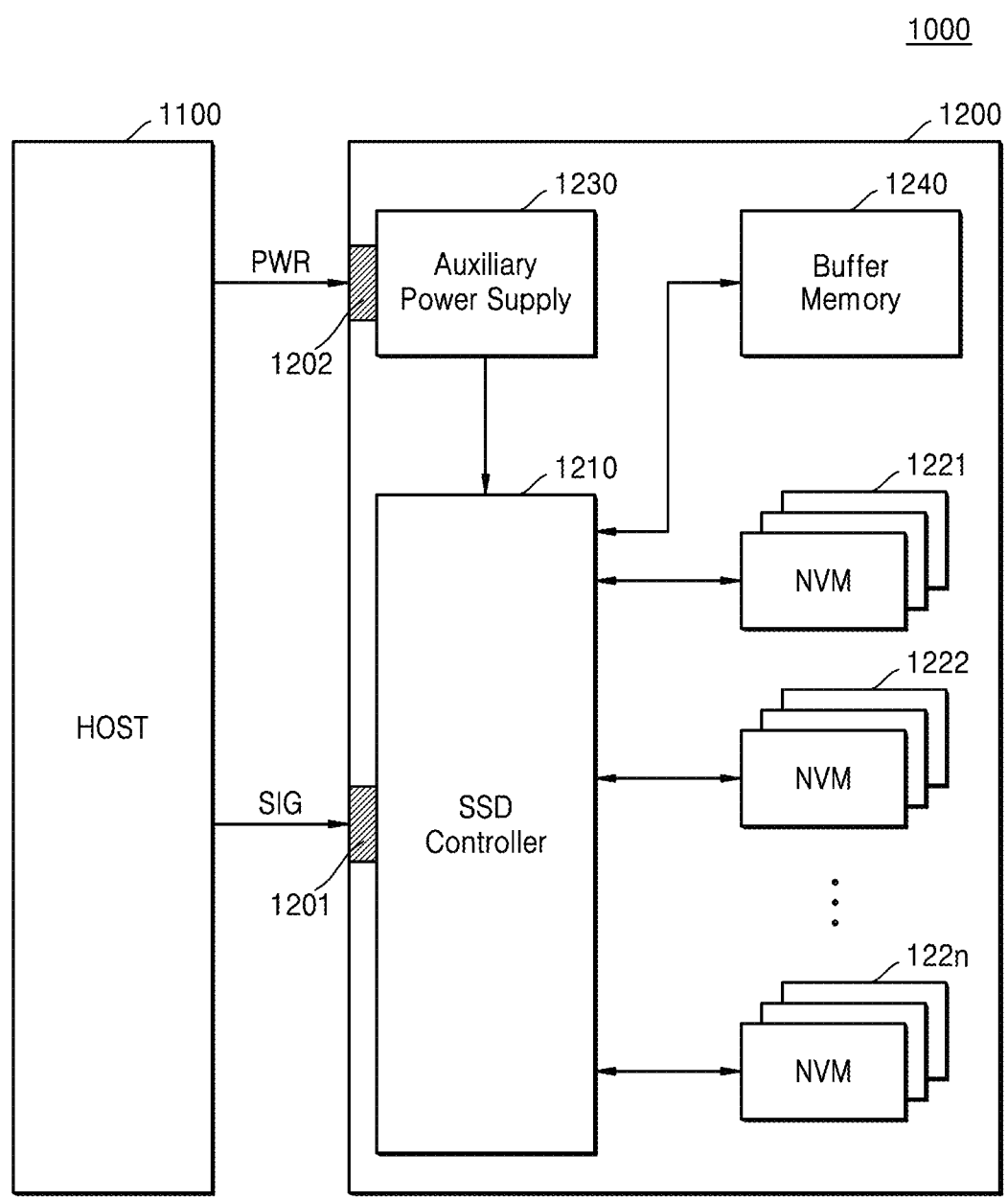
FIG. 22 is a block diagram of a solid state drive (SSD) system including a memory device, according to some example embodiments.

FIG. 22 is a block diagram of an SSD system including a memory device, according to some example embodiments. Referring to FIG. 22, an SSD system 1000 includes a host 1100 and an SSD 1200.

The SSD 1200 may exchange signals SIG with the host 1100 through a signal connector 1201 and may receive power PWR through a power connector 1202. The SSD 1200 may include an SSD controller 1210, a plurality of flash memories 1221 through 122n, an auxiliary power supply 1230, and a buffer memory 1240. The flash memories 1221 through 122n may be connected to the SSD controller 1210 through a plurality of channels, respectively.

The SSD controller 1210 may control the flash memories 1221 through 122n in response to a signal SIG received from the host 1100. The SSD controller 1210 may store an internally generated signal or an externally received signal (e.g., the signal SIG received from the host 1100) in the buffer memory 1240. The SSD controller 1210 may correspond to the memory controller 100 described above with reference to FIGS. 1 through 21.

The flash memories 1221 through 122n may operate under the control of the SSD controller 1210. The auxiliary power supply 1230 is connected to the host 1100 through the power connector 1202. Each of the flash memories 1221 through 122n may correspond to any one of the memory devices 200, 300a, and 300b described above with reference to FIGS. 1 through 21. For example, each of or at least some of the flash memories 1221 through 122n may include normal memory cells and redundant memory cells. Each of the flash memories 1221 through 122n may perform column repair in a column repair unit corresponding to a repair group.

The auxiliary power supply 1230 may be connected to the host 1100 through the power connector 1202. The auxiliary power supply 1230 may receive the power PWR from the host 1100 and may be charged. The auxiliary power supply 1220 may supply power to the SSD 1200 when power is not smoothly supplied from the host 1100.

Any of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

While inventive concepts have been particularly shown and described with reference to embodiments thereof, it will be understood that various changes in form and details may be made therein without departing from the spirit and scope of the following claims.

What is claimed is:

1. A memory device comprising:
a memory cell array including normal memory cells and redundant memory cells;
first page buffers connected to the normal memory cells through first bit lines, the first bit lines divided into at least a first bit line group including a first plurality of bit lines and a second bit line group including a second plurality of bit lines, the first page buffers divided into a first repair group corresponding to the first bit line group and a second repair group corresponding to the second bit line group, the first and second repair groups arranged in a first area and collinear in a first direction, the first area corresponding to the first bit lines extending in the first direction; and
second page buffers connected to the redundant memory cells through second bit lines divided into at least a third bit line group including a third plurality of bit lines and a fourth bit line group including a fourth plurality of bit lines, the second page buffers divided into a third repair group corresponding to the third bit line group and a fourth repair group corresponding to the fourth bit line group, the third and fourth repair groups arranged in a second area and collinear in the first direction, the second area corresponding to the second bit lines extending in the first direction,
wherein the first repair group is adjacent to the second repair group in the first direction, the third repair group is adjacent to the fourth repair group in the first direction, and
wherein, in response to at least one normal memory cell of the first repair group connected to the first bit line group being determined as a defective cell, the memory device is configured to replace each of the normal memory cells connected to the first bit line group with respective each of the redundant memory cells connected to the third bit line group.

2. The memory device of claim 1, wherein the first area is separate from the second area in a second direction, the second direction perpendicular to the first direction.

3. The memory device of claim 2, wherein
a number of the first bit lines corresponds to a width of a gate of a transistor in the second direction, the transistor included in each of the first and second page buffers; and
transistors included in each of the first and second page buffers are collinear in the first direction.

4. The memory device of claim 1, wherein the first through fourth bit line groups include a same number of bit lines as one another.

5. The memory device of claim 4, wherein the number of bit lines of each of the first through fourth bit line groups is less than or equal to 6.

6. The memory device of claim 1, further comprising:
peripheral circuitry configured to output, as a decoder output signal, first data received from the first page buffers through a first wired OR line and second data received from the second page buffers through a second wired OR line, the decoder output signal according to column repair information,
to calculate a fail bit count of first data and second data based on the decoder output signal, the first data and second data being programmed in a program operation, and
to determine a program pass or program fail, the determining according to the fail bit count.

7. The memory device of claim 6, wherein the peripheral circuitry includes:
first through fourth latches configured to respectively store first column repair information, second column repair information, third column repair information, and fourth column repair information respectively corresponding to the first through fourth bit line groups;
a first switch configured to output the first data according to the first column repair information and the second column repair information, the outputting the first data in response to a first selection signal corresponding to the first bit line group or a second selection signal corresponding to the second bit line group being in an enabled state; and
a second switch configured to output the second data according to the third column repair information and the fourth column repair information, the outputting the second data in response to a third selection signal corresponding to the third bit line group or a fourth selection signal corresponding to the fourth bit line group being in the enabled state.

8. The memory device of claim 1, further comprising:
peripheral circuitry configured to output as a decoder output signal, first data received from the first repair group connected to the first bit line group through a first wired OR line, second data received from the second repair group connected to the second bit line group through a second wired OR line, third data received from page buffers connected to the third bit line group through a third wired OR line, and fourth data received from the fourth repair group connected to the fourth bit line group through a fourth wired OR line, the outputting according to column repair information,
to calculate a fail bit count of the first through fourth data based on the decoder output signal, the first through fourth data being programmed in a program operation, and
to determine a program pass or a program fail, the determining according to the fail bit count.

9. The memory device of claim 1, wherein the memory cell array is in a first semiconductor layer;
the first and second page buffers are in a second semiconductor layer below the first semiconductor layer, and
the first semiconductor layer and the second semiconductor layer are arranged in a vertical direction on the basis of a semiconductor substrate.

10. The memory device of claim 1, wherein the memory cell array is on a first substrate,
the first and second page buffers are on a second substrate, and
the first and second bit lines are connected to the first and second page buffers through bonding metals.

11. A memory device comprising:
a memory cell array including:
normal memory cells connected to first bit lines divided into normal bit line groups and extending in a first direction, each of the normal bit line groups including a plurality of bit lines, and
redundant memory cells connected to second bit lines divided into redundant bit line groups and extending in the first direction, each of the redundant bit line groups including a plurality of bit lines; and
peripheral circuitry including:
first page buffers connected to the first bit lines, the first page buffers being adjacent to each other in the first direction, and
second page buffers connected to the second bit lines, the second page buffers being adjacent to each other in the first direction,
the peripheral circuitry configured to output, as a decoder output signal, first data received from the first page buffers through a first wired OR line and second data received from the second page buffers through a second wired OR line, the outputting according to column repair information,
wherein, in response to at least one of the normal memory cells being determined as a defective cell, the memory device is configured to generate the column repair information to indicate that one of the normal bit line groups corresponds to one of the redundant bit line groups.

12. The memory device of claim 11, wherein the first page buffers are collinear in the first direction and in a first area, the first area corresponding to the first bit lines extending in the first direction, and the second page buffers are arranged collinear in the first direction and in a second area, the second area corresponding to the second bit lines extending in the first direction.

13. The memory device of claim 12, wherein the first area is separated from the second area in a second direction that is perpendicular to the first direction.

14. The memory device of claim 13, wherein a number of the first bit lines corresponds to a width of a gate of a transistor in the second direction, the transistor included in each of the first page buffers; and
transistors included in each of the first page buffers are collinear in the first direction.

15. The memory device of claim 11, wherein the peripheral circuitry is configured to
calculate a fail bit count of the first data or the second data based on the decoder output signal, the first data or the second data being programmed in a program operation, and
to determine a program pass or fail according to the fail bit count.

16. The memory device of claim 11, wherein the peripheral circuitry includes:
first latches each configured to store normal column repair information for a corresponding one of the normal bit line groups;
second latches each configured to store redundant column repair information for a corresponding one of the redundant bit line groups;

a first switch configured to output the first data according to the normal column repair information in response to first selection signals corresponding to the normal bit line groups; and a second switch configured to output the second data according to the redundant column repair information in response to second selection signals corresponding to the redundant bit line groups.

17. The memory device of claim 11, wherein each of the first page buffers includes a pass/fail transistor having an end and an opposite end, the end connected to a sensing latch that is configured to store data read from the memory cell array, and the opposite end connected to the first wired OR line.

18. A memory device comprising:

a memory cell array including normal memory cells and redundant memory cells;

first page buffers connected to the normal memory cells through first bit lines, the first bit lines divided into at least a first bit line group including a first plurality of bit lines and a second bit line group including a second plurality of bit lines, the first page buffers arranged in a first area and collinearly in a first direction, the first area corresponding to the first bit lines extending in the first direction;

second page buffers connected to the redundant memory cells through second bit lines divided into at least a third bit line group including a third plurality of bit lines and a fourth bit line group, including a fourth plurality of bit lines, the second page buffers arranged in a second area and collinearly in the first direction, the second area corresponding to the second bit lines extending in the first direction; and a peripheral circuitry including first through fourth latches configured to respectively store first column repair information, second column repair information, third column repair information, and fourth column repair information respectively corresponding to the first through fourth bit line groups, wherein a number of the first bit lines corresponds to a width of a gate of a transistor in a second direction perpendicular to the first direction, the transistor included in each of the first page buffers; and transistors included in each of the first page buffers are collinear in the first direction.

19. The memory device of claim 18, wherein the peripheral circuitry is configured to output, as a decoder output signal, first data received from the first page buffers through a first wired OR line and second data received from the second page buffers through a second wired OR line, the outputting according to the first through fourth column repair information.

20. The memory device of claim 19, wherein the peripheral circuitry is configured to calculate a fail bit count of data based on the decoder output signal, the data being programmed in a program operation, and to determine a program pass or program fail according to the fail bit count.

* * * * *